United States Patent
Yamagishi et al.

(10) Patent No.: US 9,787,218 B2
(45) Date of Patent: Oct. 10, 2017

(54) CAPACITIVE LOAD DRIVING CIRCUIT

(75) Inventors: Shogo Yamagishi, Hamamatsu (JP); Masatoshi Fujimoto, Hamamatsu (JP); Akira Takahashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 592 days.

(21) Appl. No.: 14/355,401

(22) PCT Filed: Aug. 23, 2012

(86) PCT No.: PCT/JP2012/071348
§ 371 (c)(1),
(2), (4) Date: Apr. 30, 2014

(87) PCT Pub. No.: WO2013/065387
PCT Pub. Date: May 10, 2013

(65) Prior Publication Data
US 2014/0285021 A1 Sep. 25, 2014

(30) Foreign Application Priority Data
Nov. 2, 2011 (JP) .................... 2011-241337

(51) Int. Cl.
*H02J 7/34* (2006.01)
*H02J 1/10* (2006.01)
(Continued)

(52) U.S. Cl.
CPC .......... *H02M 7/537* (2013.01); *G02F 1/0327* (2013.01); *H01S 3/235* (2013.01); *H03K 4/023* (2013.01); *H01S 3/0057* (2013.01); *H01S 3/0064* (2013.01); *H01S 3/08* (2013.01); *H01S 3/1075* (2013.01); *H03K 17/102* (2013.01); *H03K 17/691* (2013.01); *H03K 2017/6875* (2013.01); *H03K 2217/009* (2013.01); *Y10T 307/549* (2015.04)

(58) Field of Classification Search
CPC ..... H02M 7/537; H03K 4/023; H03K 17/691; H03K 17/102
See application file for complete search history.

(56) References Cited

U.S. PATENT DOCUMENTS

| 3,659,190 | A | | 4/1972 | Galluppi |
| 5,548,234 | A | * | 8/1996 | Turi ..................... G02F 1/0327 327/108 |

(Continued)

FOREIGN PATENT DOCUMENTS

| CN | 1574523 | | 2/2005 | |
| DE | 3630775 A1 | * | 3/1988 | ....... H03K 17/04123 |

(Continued)

OTHER PUBLICATIONS

English-language translation of International Preliminary Report on Patentability (IPRP) dated May 15, 2014 that issued in WO Patent Application No. PCT/JP2012/071348.

*Primary Examiner* — Rexford Barnie
*Assistant Examiner* — Rasem Mourad
(74) *Attorney, Agent, or Firm* — Drinker Biddle & Reath LLP

(57) ABSTRACT

A driving circuit is a circuit selectively outputting one of a staircase wave and a square wave from an output terminal, to drive a capacitive load, and includes a first power source supplying a constant voltage VH, a first FET connected between the output terminal and the first power source, a first transformer in which an output side coil is connected to a gate of the first FET, a first input terminal connected to an input side coil of the first transformer via a capacitive element, a second power source supplying a constant voltage VL, a second FET connected between the output terminal and the second power source, a second transformer in which an output side coil is connected to a gate of the second FET, and a second input terminal connected to an input side coil of the second transformer via a capacitive element.

16 Claims, 24 Drawing Sheets

(51) Int. Cl.
  *H02J 3/38* (2006.01)
  *H02M 7/537* (2006.01)
  *H03K 4/02* (2006.01)
  *G02F 1/03* (2006.01)
  *H01S 3/23* (2006.01)
  *H03K 17/691* (2006.01)
  *H03K 17/687* (2006.01)
  *H01S 3/08* (2006.01)
  *H01S 3/107* (2006.01)
  *H01S 3/00* (2006.01)
  *H03K 17/10* (2006.01)

(56) References Cited

U.S. PATENT DOCUMENTS

| | | |
|---|---|---|
| 5,567,997 A | 10/1996 | Suzuki et al. |
| 6,812,919 B1 * | 11/2004 | Park ................. H04N 3/20 345/210 |
| 2012/0002685 A1 * | 1/2012 | Bergmann ........... H01S 3/107 372/10 |
| 2016/0233673 A1 * | 8/2016 | Gazit .................. H02J 1/10 |

FOREIGN PATENT DOCUMENTS

| | | |
|---|---|---|
| DE | 36 30 775 | 10/1991 |
| DE | 10 2009 006 154 | 7/2010 |
| JP | S58-36179 A | 3/1983 |
| JP | 03210812 A * | 9/1991 |
| JP | H03-210812 A | 9/1991 |
| JP | H03-263912 A | 11/1991 |
| JP | H04-309010 A | 10/1992 |
| JP | H06-51847 A | 2/1994 |
| JP | H10-191650 A | 7/1998 |
| JP | 2007-325332 A | 12/2007 |
| JP | 2007325332 A * | 12/2007 |
| WO | WO 2010/083827 | 7/2010 |

* cited by examiner

Fig.14
(a)
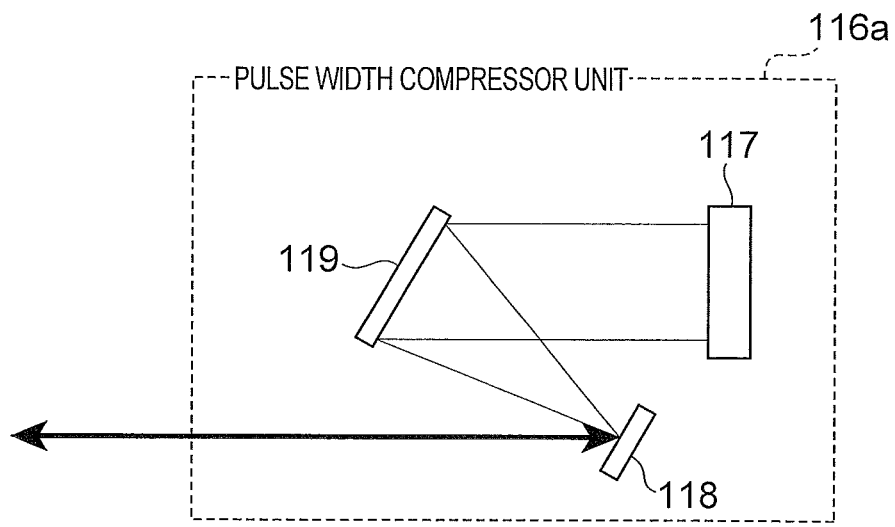
(b)
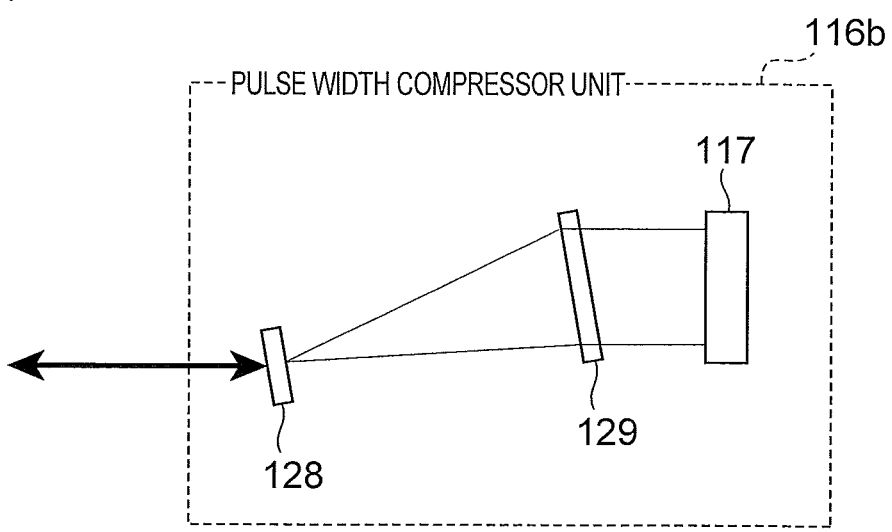

Fig. 17

| CONDITION | GATE INPUT PULSE | | | | STAIRCASE WAVE OUTPUT | | | |
|---|---|---|---|---|---|---|---|---|
| | V_ON [V] | V_OFF [V] | W_ON [ns] | W_OFF [ns] | STEP VOLTAGE(+) [V] | STEP VOLTAGE(-) [V] | NUMBER OF STEPS(+) | NUMBER OF STEPS(-) |
| ① | 4 | 4 | 10 | 10 | 500 | 500 | 9 | 8 |
| ② | 4.5 | 4.5 | 10 | 10 | 850 | 900 | 5 | 5 |
| ③ | 5 | 5 | 10 | 10 | 1200 | 1200 | 4 | 3 |
| ④ | 4 | 4 | 20 | 20 | 630 | 650 | 7 | 7 |
| ⑤ | 4.5 | 4.5 | 20 | 20 | 1100 | 1200 | 4 | 4 |
| ⑥ | 5 | 5 | 20 | 20 | 1550 | 1650 | 3 | 2 | ered in a regenerative amplifier to various conditions.

CAPACITIVE LOAD DRIVING CIRCUIT

TECHNICAL FIELD

The present invention relates to a capacitive load driving circuit.

BACKGROUND ART

In Patent Document 1, there is described a staircase wave generating circuit. The circuit described in this document includes a voltage-dividing circuit, a switch circuit, and a trigger circuit. The voltage-dividing circuit has a plurality of resistors which are connected in series between two electric power sources which are different in voltage level from each other, and divides a difference in potential between the two power sources into a plurality of levels. The switch circuit has a plurality of switch elements (FETs) which are connected in series between the two power sources, and the plurality of switch elements are respectively connected in parallel to the plurality of respective resistors. One end of the switch circuit is a signal output terminal, and the trigger circuit turns on the plurality of switch elements sequentially from the side of the signal output terminal. Thereby, voltage levels which are resistance voltage divided are output as a stair-shaped voltage (staircase wave) from the signal output terminal.

In Patent Document 2, there is described a staircase wave generating circuit. The circuit described in this document includes a generator that generates digital data containing a staircase wave, a digital-analog converter that converts the digital data into an analog current, a circuit that shifts a level of the analog current, a current-voltage converter circuit that converts the analog current into a voltage output, and a transistor that differentially-amplifies the voltage output.

CITATION LIST

Patent Literature

Patent Document 1: Japanese Patent Application Laid-Open No. H3-210812
Patent Document 2: Japanese Patent Application Laid-Open No. H3-263912

SUMMARY OF INVENTION

Technical Problem

For example, there is a regenerative amplifier as an optical amplification device that amplifies ultrashort pulsed light with a pulse width of approximately picoseconds to femtoseconds. The regenerative amplifier is to confine ultrashort pulsed light inside a resonator containing an optical amplifying medium on the optical path, and extract the ultrashort pulsed light amplified by the optical amplifying medium from the resonator after a certain period of time.

In such a regenerative amplifier, a mechanism for confining ultrashort pulsed light inside the resonator in a timely manner, and extracting the light is required. An electro-optic modulation element such as a Pockels cell which changes a polarization state of ultrashort pulsed light by an electro-optic effect of crystal is to be used for this mechanism. Such an electro-optic modulation element and a polarizing beam splitter are disposed on the optical path in the resonator, so as to always rotate polarization of seed light in a steady state. When a voltage is applied in synchronization with an input timing of the seed light (seed laser), the polarization of the seed light incident into the resonator stops rotating at this timing, therefore, the light is confined inside the resonator. Further, when the applied voltage is canceled after a given period of time, the polarization of the ultrashort pulsed light amplified by the optical amplifying medium rotates, and the light is extracted via the polarizing beam splitter.

Usually, an electro-optic modulation element such as a Pockels cell is driven by a high-voltage pulse of approximately several kV with a rising time and a falling time from several nanoseconds to several tens of nanoseconds. However, because a general driving circuit is capable of generating only a constant form high-voltage pulse, it is difficult to respond to a demand for adapting pulsed light to be generated in a regenerative amplifier to various conditions. For example, according to research by the present inventors, in material processing using high-power laser light, by arbitrarily changing a time width of pulsed light according to a type of an object material to be processed, it is possible to realize an optimum processed result. Then, according to the research by the present inventors, it has become apparent that, in order to arbitrarily change a time width of pulsed light, it is preferable that a waveform of a high-voltage pulse to be applied to the electro-optic modulation element is made stair-shaped, and the number of steps and the amounts of changes in voltage at the respective steps, and further the time widths of the respective steps are variously changed. However, in a conventional driving circuit, it is difficult to make such various changes to a waveform of a high-voltage pulse.

In addition, because the staircase wave generating circuit described in Patent Document 1 generates a staircase wave pulse by resistance voltage dividing, the voltage levels at the respective steps of the staircase wave pulse are determined according to a division ratio of the resistances, and it is difficult to change the number of steps and the amounts of changes in voltage at the respective steps. Further, because the staircase wave generating circuit described in Patent Document 2 generates a staircase wave pulse by an amplifier, it is difficult to change the number of steps and the amounts of changes in voltage at the respective steps in high-speed rising time and falling time from several nanoseconds to several tens of nanoseconds as required for driving an electro-optic modulation element such as a Pockels cell.

The present invention has been achieved in consideration of these problems, and an object thereof is to provide a capacitive load driving circuit which is capable of providing a stair-shaped high-voltage pulse to a capacitive load such as an electro-optic modulation element, and is capable of variously changing the number of steps and the amounts of changes in voltage at the respective steps, and further the time widths of the respective steps.

Solution to Problem

In order to solve the above-described problems, a first capacitive load driving circuit according to the present invention which has an output terminal connected to a capacitive load, and selectively outputs one of a staircase wave and a square wave from the output terminal, to drive the capacitive load, the circuit includes (1) a first constant potential line supplying a first constant voltage, (2) a first transistor whose one current terminal is connected to the output terminal, and whose other current terminal is connected to the first constant potential line, (3) a first transformer which has an input side coil and an output side coil, and the output side coil is connected to a control terminal of the first transistor, (4) a first input terminal which is connected to one end of the input side coil of the first transformer via a capacitive element, and to which a first pulsed voltage is input, (5) a second constant potential line supplying a second constant voltage lower than the first constant voltage, (6) a second transistor whose one current terminal is connected to the output terminal, and whose other current terminal is connected to the second constant potential line, (7) a second transformer which has an input side coil and an output side coil, and the output side coil is connected to a control terminal of the second transistor, and (8) a second input terminal which is connected to one end of the input side coil of the second transformer via a capacitive element, and to which a second pulsed voltage is input. Then, levels of pulsed voltages to be input to the control terminals of the first and second transistors by the first and second pulsed voltages are higher than or equal to respective threshold voltages of the first and second transistors.

Further, a second capacitive load driving circuit according to the present invention which has an output terminal connected to a capacitive load, and selectively outputs one of a staircase wave and a square wave from the output terminal, to drive the capacitive load, the circuit includes (1) a first constant potential line supplying a first constant voltage, (2) M (where M is an integer of 2 or more) first transistors which are connected in series between the output terminal and the first constant potential line, (3) M first transformers which respectively have input side coils and output side coils, and the output side coils are connected to respective control terminals of the M first transistors, (4) a first input terminal which is connected to one ends of the respective input side coils of the M first transformers via capacitive elements, and to which a first pulsed voltage is input, (5) a second constant potential line supplying a second constant voltage lower than the first constant voltage, (6) N (where N is an integer of 2 or more) second transistors which are connected in series between the output terminal and the second constant potential line, (7) N second transformers which respectively have input side coils and output side coils, and the output side coils are connected to respective control terminals of the N second transistors, and (8) a second input terminal which is connected to one ends of the respective input side coils of the N second transformers via capacitive elements, and to which a second pulsed voltage is input. Then, levels of pulsed voltages to be input to the control terminals of the first and second transistors by the first and second pulsed voltages are higher than or equal to respective threshold voltages of the first and second transistors.

These first and second capacitive load driving circuits are capable of operating as follows. At the time of generating a stair-shaped high-voltage pulse, the first pulsed voltages are input plural times to the first input terminal. In accordance with this, the first transistor is brought into an on-state intermittently plural times, and a current at a level proportional to a peak voltage value of the first pulsed voltage is supplied to the capacitive load (for example, an electro-optic modulation element such as a Pockels cell) only for a time which is the same as a time width of the first pulsed voltage, to be accumulated in one electrode of the capacitive load. At this time, the voltage values output from the output terminal (i.e., the electrode potentials of the capacitive load) are to indicate values corresponding to products of the levels of the respective currents and the time widths thereof. In detail, first, when the first pulsed voltage of the first time is input, a voltage value at the output terminal becomes a value corresponding to a product of the level of the current and the time width thereof. Next, when the first pulsed voltage of the second time is input after a predetermined time interval, a voltage value at the output terminal becomes a value that a voltage value corresponding to a product of the level of the current and the time width thereof is added to the previous voltage value. In this way, every time the first pulsed voltage is input, the voltage value at the output terminal increases in a staircase manner.

Thereafter, the second pulsed voltages are input plural times to the second input terminal. In accordance with this, the second transistor is brought into an on-state intermittently plural times, and a current at a level proportional to a peak voltage value of the second pulsed voltage flows out of the capacitive load only for a time which is the same as a time width of the second pulsed voltage. At this time, the voltage values at the output terminal are to indicate values corresponding to products of the levels of the currents and the time widths thereof. In detail, first, when the second pulsed voltage of the first time is input, a voltage value at the output terminal becomes a value that a voltage value corresponding to a product of the level of the current and the time width thereof is subtracted from the voltage value mentioned above. Next, when the second pulsed voltage of the second time is input after a predetermined time interval, a voltage value at the output terminal becomes a value that a voltage value corresponding to a product of the level of the current and the time width thereof is subtracted from the previous voltage value. In this way, every time the second pulsed voltage is input, the voltage value at the output terminal decreases in a staircase manner.

In this way, in the first and second capacitive load driving circuits, a stair-shaped high-voltage pulse is generated at the output terminal by the first and second pulsed voltages which are input to the first and second input terminals. Then, it is possible to arbitrarily change the amounts of changes in voltage at the respective steps of the stair-shaped high-voltage pulse by changing the peak voltages and the time widths of the first and second pulsed voltages, and further, it is possible to arbitrarily change the time widths of the respective steps of the stair-shaped high-voltage pulse by changing the time intervals of the first and second pulsed voltages. That is, in accordance with the first and second capacitive load driving circuits, it is possible to provide a stair-shaped high-voltage pulse to a capacitive load such as an electro-optic modulation element, and it is possible to variously change the number of steps, the amounts of changes in voltage at the respective steps, and further the time widths of the respective steps.

Further, in accordance with the first and second capacitive load driving circuits, the first and second pulsed voltages are set to high values which are higher than or equal to the gate threshold voltages of the first and second transistors, and the electric charge and discharge of the capacitive load are respectively completed by one-time pulse, thereby it is also possible to generate a square wave having high-speed rising and falling characteristics.

Advantageous Effects of Invention

In accordance with the capacitive load driving circuit according to the present invention, it is possible to provide a stair-shaped high-voltage pulse to a capacitive load such as an electro-optic modulation element, and it is also possible to variously change the number of steps, the amounts of changes in voltage at the respective steps, and further the time widths of the respective steps.

BRIEF DESCRIPTION OF DRAWINGS

FIG. 14 includes diagrams showing (a), (b) configuration examples of pulse width compressor units.

FIG. 17 is a table showing input conditions for generating a staircase wave pulse in a first example.

DESCRIPTION OF EMBODIMENTS

Hereinafter, embodiments of a capacitive load driving circuit according to the present invention will be described in detail with reference to the accompanying drawings. In addition, in the description of the drawings, the same components are denoted by the same reference symbols, and overlapping descriptions will be omitted.

First Embodiment

Figure 1:
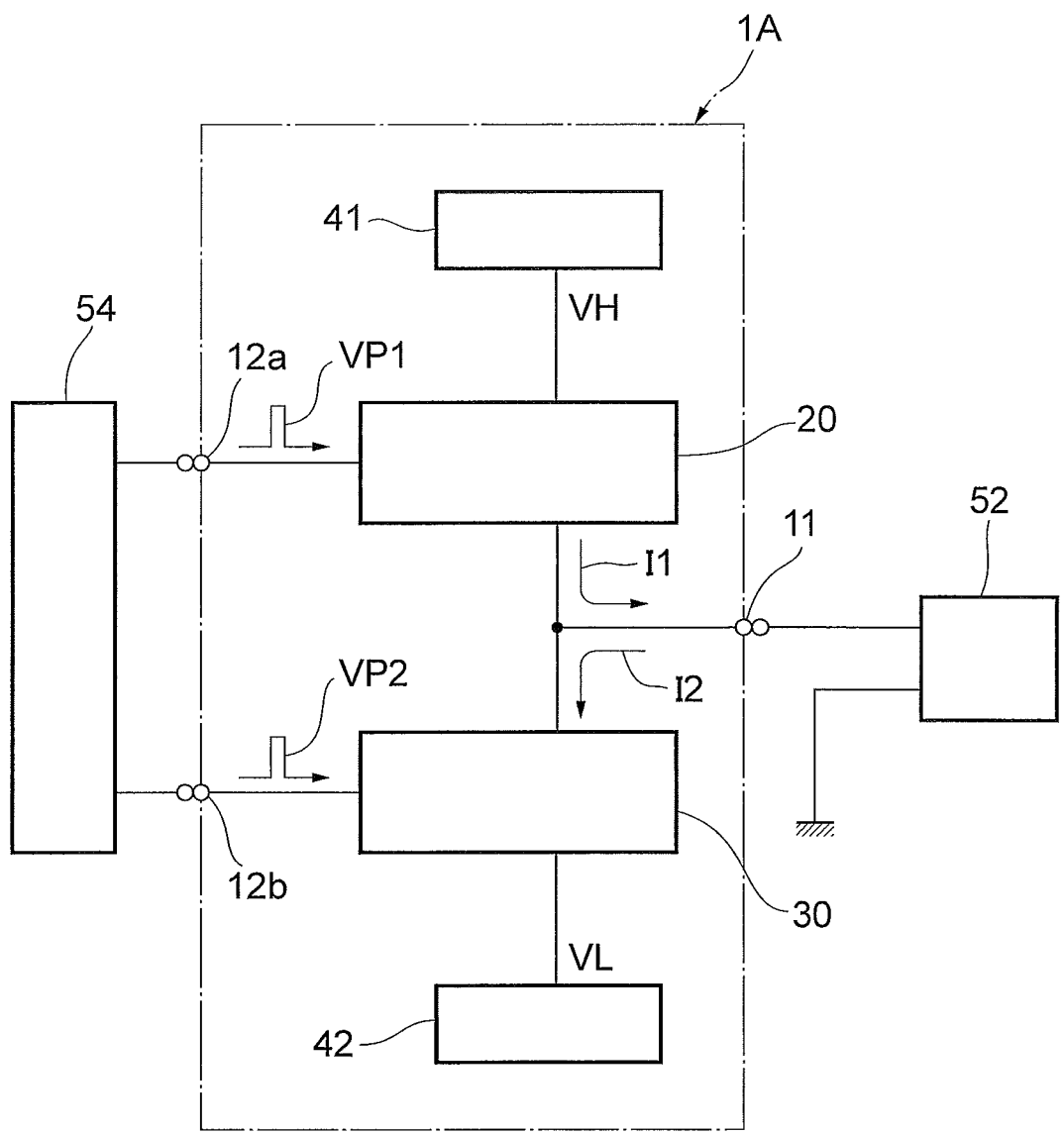
FIG. 1 is a diagram schematically showing a configuration of a capacitive load driving circuit according to a first embodiment.

FIG. 1 is a diagram schematically showing a configuration of a capacitive load driving circuit according to a first embodiment of the present invention. As shown in FIG. 1, this capacitive load driving circuit 1A includes an output terminal 11 which is connected to a capacitive load 52, and a first input terminal 12a and a second input terminal 12b which are connected to a pulsed voltage generating circuit 54. The capacitive load driving circuit 1A drives the capacitive load 52 by selectively outputting one of a staircase wave and a square wave from the output terminal 11 on the basis of pulse signals input from the input terminals 12a and 12b. The capacitive load 52 is, for example, a modulation element utilizing an electro-optic effect, and a Pockels cell as an example.

The capacitive load driving circuit 1A of the present embodiment includes a first switching circuit 20, a second switching circuit 30, a first high-voltage power source 41, and a second high-voltage power source 42. The first high-voltage power source 41 is a first constant potential line in the present embodiment, and supplies a constant voltage of, for example, 1000 volts or higher. The first switching circuit 20 receives a first pulsed voltage VP1 which is input from the pulsed voltage generating circuit 54 via the input terminal 12a, and is supplied with a first constant voltage (voltage VH) from the first high-voltage power source 41. The first switching circuit 20 allows a current I1 to flow therein according to the first pulsed voltage VP1. The current I1 flowing in the first switching circuit 20 has a time width corresponding to a pulse time width of the first pulsed voltage VP1, and has a level corresponding to a pulsed voltage of the first pulsed voltage VP1. The current I1 is input to one electrode of the capacitive load 52 via the first switching circuit 20 and the output terminal 11 from the first high-voltage power source 41, to be accumulated in the one electrode. In addition, in the present embodiment, the other electrode of the capacitive load 52 is connected to a constant potential line (for example, a reference potential line).

The second switching circuit 30 receives a second pulsed voltage VP2 which is input from the pulsed voltage generating circuit 54 via the input terminal 12b, and is supplied with a second constant voltage which is lower than the first constant voltage (voltage VL<VH) from the second high-voltage power source 42. The second switching circuit 30 allows a current I2 to flow therein according to the second pulsed voltage VP2. The current I2 flowing in the second switching circuit 30 has a time width corresponding to a pulse time width of the second pulsed voltage VP2, and has a level corresponding to a pulsed voltage of the second pulsed voltage VP2. The current I2 flows into the second high-voltage power source 42 via the output terminal 11 and the second switching circuit 30 from one electrode of the capacitive load 52. In addition, the second high-voltage power source 42 is a second constant potential line in the present embodiment.

Figure 2:
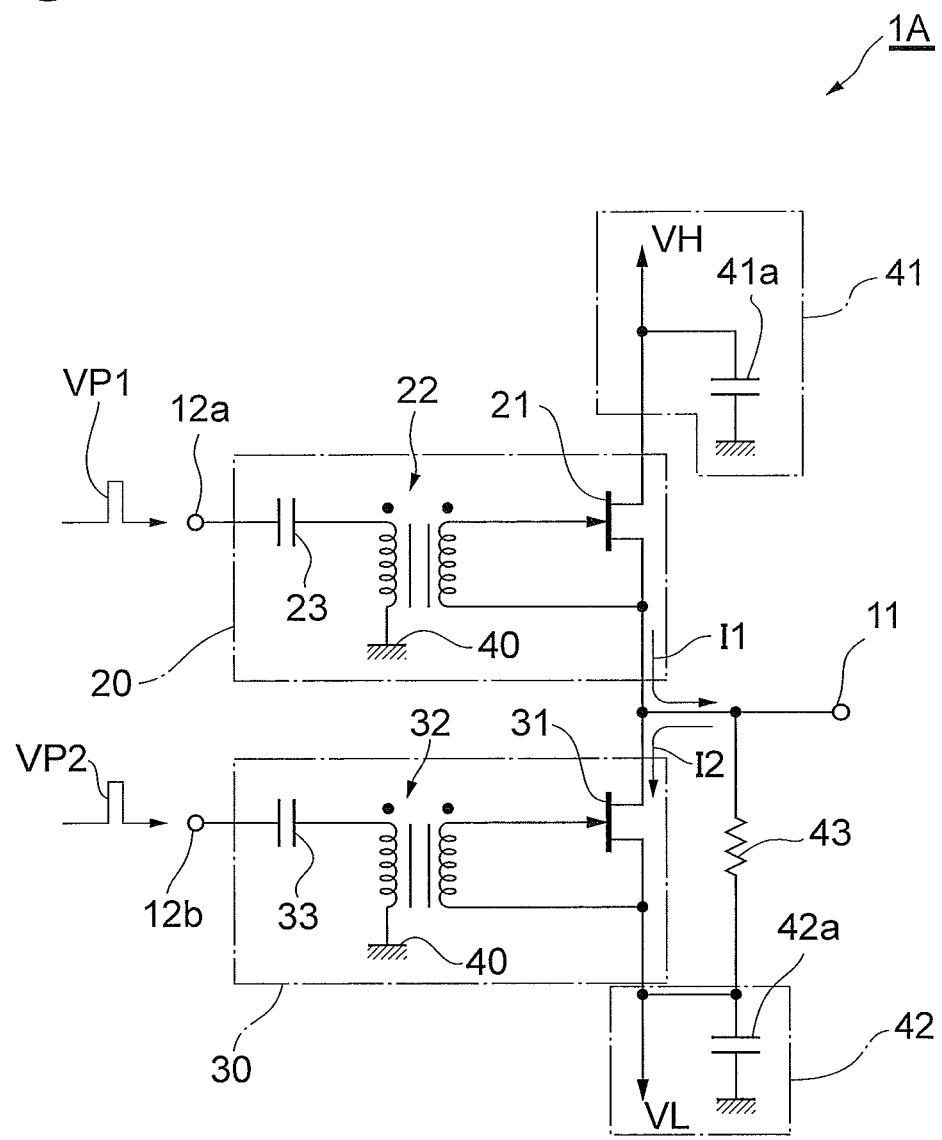
FIG. 2 is a circuit diagram showing a first specific example of the capacitive load driving circuit according to the first embodiment.

FIG. 2 is a circuit diagram showing a first specific example of the capacitive load driving circuit 1A according to the present embodiment. As shown in FIG. 2, the first switching circuit 20 is configured to include a high-voltage first transistor (FET in the present embodiment) 21, a first transformer 22, and a first capacitive element (capacitor) 23. The first FET 21 is connected in series between the first high-voltage power source 41 and the output terminal 11, and controls the current I1 flowing from the first high-voltage power source 41 via the output terminal 11 into the capacitive load 52. In detail, one current terminal (source in the present embodiment) of the first FET 21 is connected to the output terminal 11, and the other current terminal (drain in the present embodiment) is connected to the first high-voltage power source 41.

The first transformer 22 is for insulating a low-voltage region and a high-voltage region from each other, and is composed of, for example, an insulating transformer. The first transformer 22 has an input side coil and an output side coil. One end of the input side coil is connected to the first input terminal 12a via the first capacitive element 23, and the other end of the input side coil is connected to a reference potential line (third constant potential line) 40. In addition, the term "reference potential" used here is, for example, a ground potential. Further, one end of the output side coil is connected to a control terminal (gate) of the first FET 21, and the other end of the output side coil is connected to the source of the first FET 21.

In such a configuration, when the first pulsed voltage VP1 is input to the first input terminal 12a, only the component of the first pulsed voltage VP1 passes through the first capacitive element 23, and the direct-current component is removed. Then, due to this first pulsed voltage VP1, a pulsed voltage is applied between the gate and the source of the first FET 21 via the first transformer 22. This pulsed voltage has a time width which is the same as a pulse time width of the first pulsed voltage VP1, and has a voltage proportional to the pulsed voltage of the first pulsed voltage VP1. Thereby, the current I1 at a level proportional to the pulsed voltage of the first pulsed voltage VP1 is caused to flow between the drain and the source of the first FET 21.

Further, as shown in FIG. 2, the second switching circuit 30 is, in the same manner as the first switching circuit 20, configured to include a high-voltage second transistor (FET in the present embodiment) 31, a second transformer 32, and a second capacitive element (capacitor) 33. The second FET 31 is connected in series between the second high-voltage power source 42 and the output terminal 11, and controls the current I2 flowing from the capacitive load 52 via the output terminal 11 into the second high-voltage power source 42. In detail, one current terminal (drain in the present embodiment) of the second FET 31 is connected to the output terminal 11, and the other current terminal (source in the present embodiment) is connected to the second high-voltage power source 42.

The second transformer 32 is for insulating a low-voltage region and a high-voltage region from each other, and is composed of, for example, an insulating transformer. The second transformer 32 has an input side coil and an output side coil. One end of the input side coil is connected to the second input terminal 12b via the second capacitive element 33, and the other end of the input side coil is connected to the reference potential line (third constant potential line) 40. In addition, this reference potential line 40 may serve as a wiring in common with the reference potential line 40 to which the input side coil of the first transformer 22 is connected in the first switching circuit 20. Further, one end of the output side coil is connected to a control terminal (gate) of the second FET 31, and the other end of the output side coil is connected to the source of the second FET 31.

In such a configuration, when the second pulsed voltage VP2 is input to the second input terminal 12b, only the component of the second pulsed voltage VP2 passes through the second capacitive element 33, and the direct-current component is removed. Then, due to this second pulsed voltage VP2, a pulsed voltage is applied between the gate and the source of the second FET 31 via the second transformer 32. This pulsed voltage has a time width which is the same as a pulse time width of the second pulsed voltage VP2, and has a voltage proportional to the pulsed voltage of the second pulsed voltage VP2. Thereby, the current I2 at a level proportional to the pulsed voltage of the second pulsed voltage VP2 is caused to flow between the drain and the source of the second FET 31.

In addition, as shown in FIG. 2, the first high-voltage power source 41 and the second high-voltage power source 42 may respectively have high-voltage capacitors 41a and 42a for electric charge supply. The capacitor 41a is connected between a wiring for supplying the voltage VH and the reference potential line, and provides charges for the current I1 to the wiring. Further, the capacitor 42a is connected between a wiring for supplying the voltage VL and the reference potential line, and provides charges for the current I2 to the wiring.

Further, as shown in FIG. 2, a high-voltage resistor 43 may be connected between the second high-voltage power source 42 and the output terminal 11. In accordance with this high-voltage resistor 43, the voltage VL of the second high-voltage power source 42 may serve as a reference voltage at the output terminal 11. Moreover, in the case where the pulsed voltages VP1 and VP2 are not input to the input terminals 12a and 12b for a long time, the voltage at the output terminal 11 becomes VL, and a difference in potential applied to the capacitive load 52 becomes 0, and therefore, it is possible to safely stop the entire device including the capacitive load driving circuit 1A and the capacitive load 52 at the time of malfunction of the pulsed voltage generating circuit 54 (refer to FIG. 1).

Figure 3:
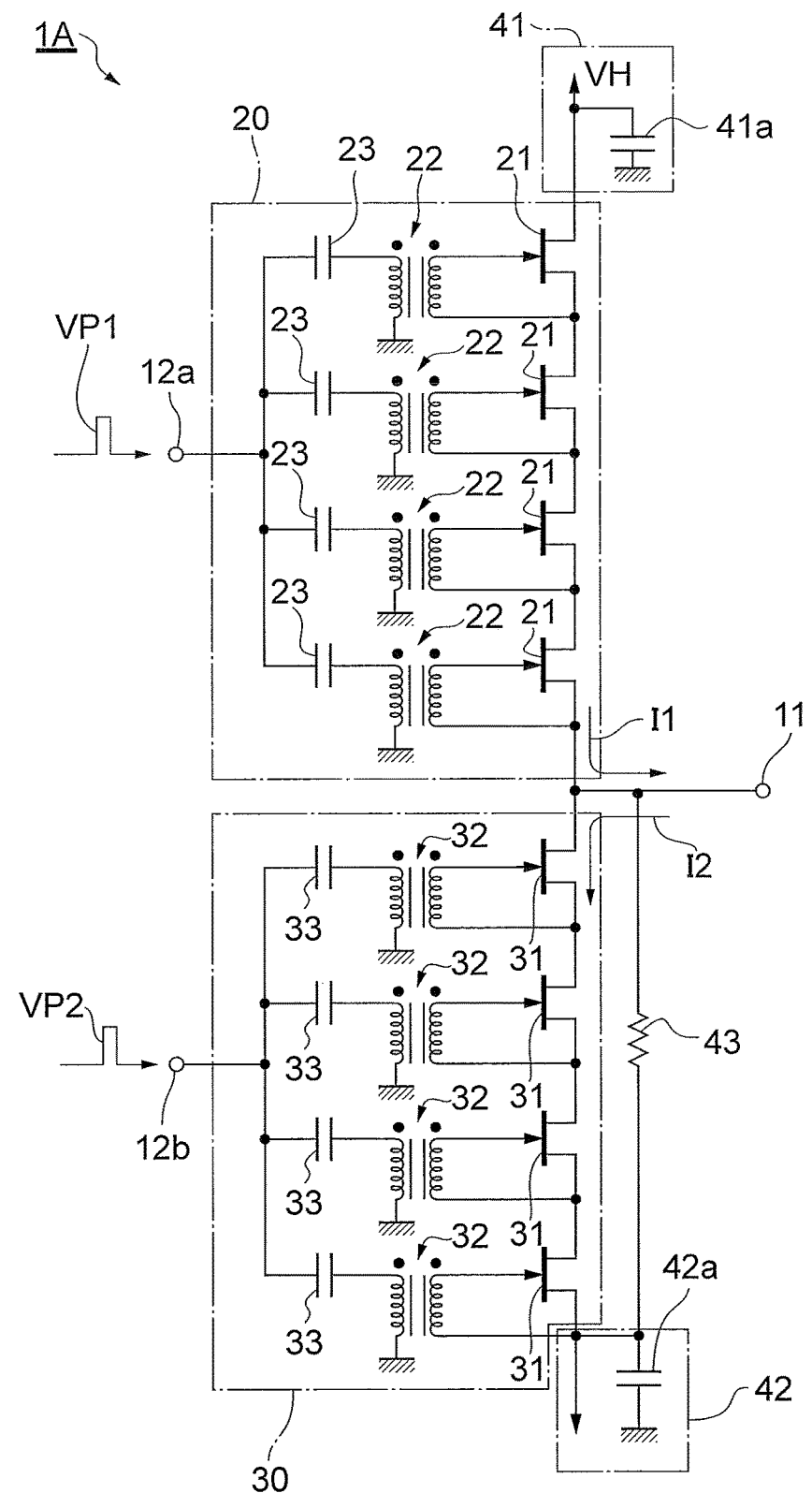
FIG. 3 is a circuit diagram showing a second specific example of the capacitive load driving circuit according to the first embodiment.

FIG. 3 is a circuit diagram showing a second specific example of the capacitive load driving circuit 1A according to the present embodiment. The point of difference between the configuration example shown in FIG. 3 and the configuration example shown in FIG. 2 is the configuration of a switching circuit.

In this example, the first switching circuit 20 is configured to include M (where M is an integer of 2 or more) first FETs 21, M first transformers 22, and M first capacitive elements 23. In addition, a circuit in the case of M=4 is shown in FIG. 3. The M first FETs 21 are connected in series between the first high-voltage power source 41 and the output terminal 11, and controls the current I1 flowing from the first high-voltage power source 41 via the output terminal 11 into the capacitive load 52. In detail, one of the drain and the source of the first FET 21 and the other one of the drain and the source of the first FET 21 adjacent to that first FET 21 are connected to one another. Further, one of the drain and the source (source in the present embodiment) of the first FET 21 located at one end of this series circuit is connected to the output terminal 11, and the other one of the drain and the source (drain in the present embodiment) of the first FET 21 located at the other end is connected to the first high-voltage power source 41.

The M first transformers 22 are composed of, for example, insulating transformers, and are respectively provided so as to correspond one-on-one to the M first FETs 21. The respective first transformers 22 have input side coils and output side coils. One ends of the input side coils are connected to the first input terminal 12a via the M respective first capacitive elements 23, and the other ends of the input side coils are connected to the common reference potential line 40. Further, one end of the output side coil is connected to the gate of the first FET 21 corresponding to the first transformer 22, and the other end of the output side coil is connected to the source of that first FET 21.

In such a configuration, when the first pulsed voltage VP1 is input to the first input terminal 12a, only the component of the first pulsed voltage VP1 passes through the M respective first capacitive elements 23, and the pulsed voltage is applied between the gates and the sources of the M first FETs 21 via the M respective first transformers 22. This pulsed voltage has a time width which is the same as a pulse time width of the first pulsed voltage VP1, and has a voltage proportional to the pulsed voltage of the first pulsed voltage VP1. Thereby, the current I1 at a level proportional to the pulsed voltage of the first pulsed voltage VP1 is caused to flow between the drains and the sources of the M first FETs 21.

Further, as shown in FIG. 3, the second switching circuit 30 is configured to include N (where N is an integer of 2 or more) second FETs 31, N second transformers 32, and N second capacitive elements 33. In addition, the circuit in the case of N=4 is shown in FIG. 3, however, the value of N may be different from the above-described M. The N second FETs 31 are connected in series between the output terminal 11 and the second high-voltage power source 42, and controls the current I2 flowing from the capacitive load 52 via the output terminal 11 into the second high-voltage power source 42. In detail, one of the drain and the source of the second FET 31 and the other one of the drain and the source of the second FET 31 adjacent to that second FET 31 are connected to one another. Further, one of the drain and the source (drain in the present embodiment) of the second FET 31 located at one end of this series circuit is connected to the output terminal 11, and the other one of the drain and the source (source in the present embodiment) of the second FET 31 located at the other end is connected to the second high-voltage power source 42.

The N second transformers 32 are composed of, for example, insulating transformers, and are respectively provided so as to correspond one-on-one to the N second FETs 31. The respective second transformers 32 have input side coils and output side coils. One ends of the input side coils are connected to the second input terminal 12b via the N respective second capacitive elements 33, and the other ends of the input side coils are connected to the common reference potential line 40. Further, one end of the output side coil is connected to the gate of the second FET 31 corresponding to the second transformer 32, and the other end of the output side coil is connected to the source of the second FET 31.

In such a configuration, when the second pulsed voltage VP2 is input to the second input terminal 12b, only the component of the second pulsed voltage VP2 passes through the N respective second capacitive elements 33, and the pulsed voltage is applied between the gates and the sources of the N second FETs 31 via the N respective second transformers 32. This pulsed voltage has a time width which is the same as a pulse time width of the second pulsed voltage VP2, and has a voltage proportional to the pulsed voltage of the second pulsed voltage VP2. Thereby, the current I2 at a level proportional to the pulsed voltage of the second pulsed voltage VP2 is caused to flow between the drains and the sources of the N second FETs 31.

The operations of the capacitive load driving circuit 1A including the above-described configuration will be described. The capacitive load driving circuit 1A of the present embodiment is capable of operating in two operating modes (a staircase wave generating mode, a square wave generating mode) which will be described hereinafter.

<Staircase Wave Generating Mode>

Figure 4:
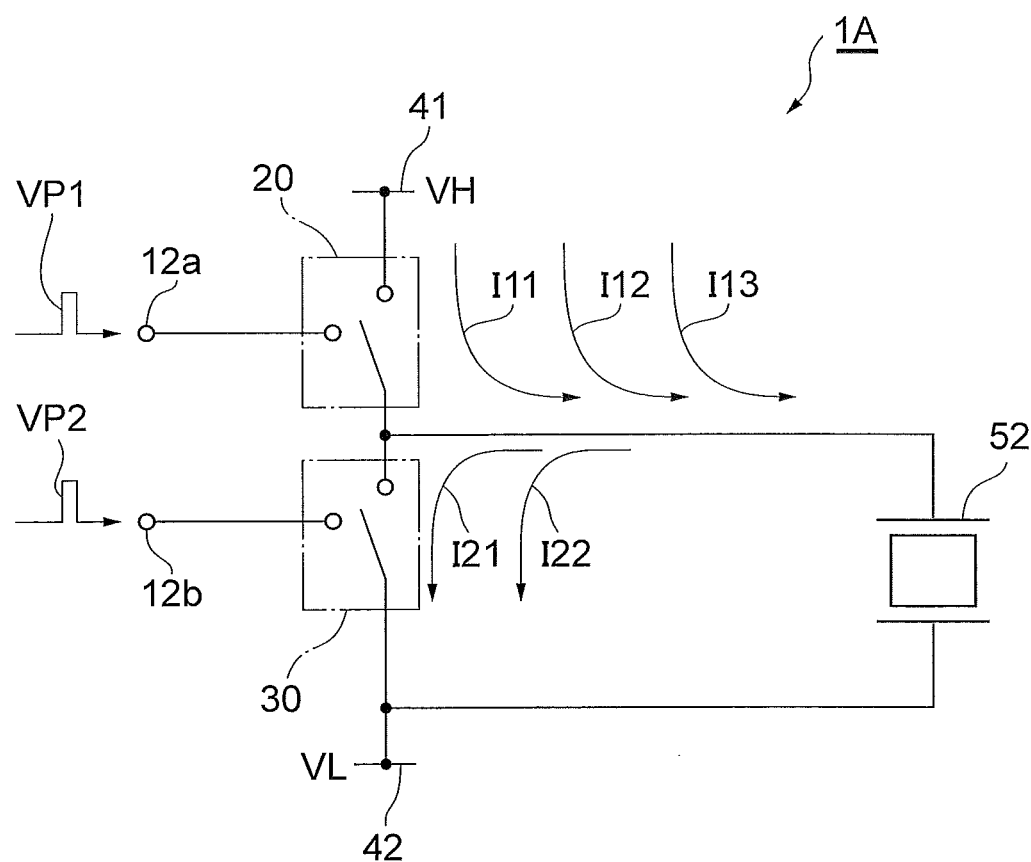
FIG. 4 is a diagram schematically showing the operation of the capacitive load driving circuit in a staircase wave generating mode.
Figure 5:
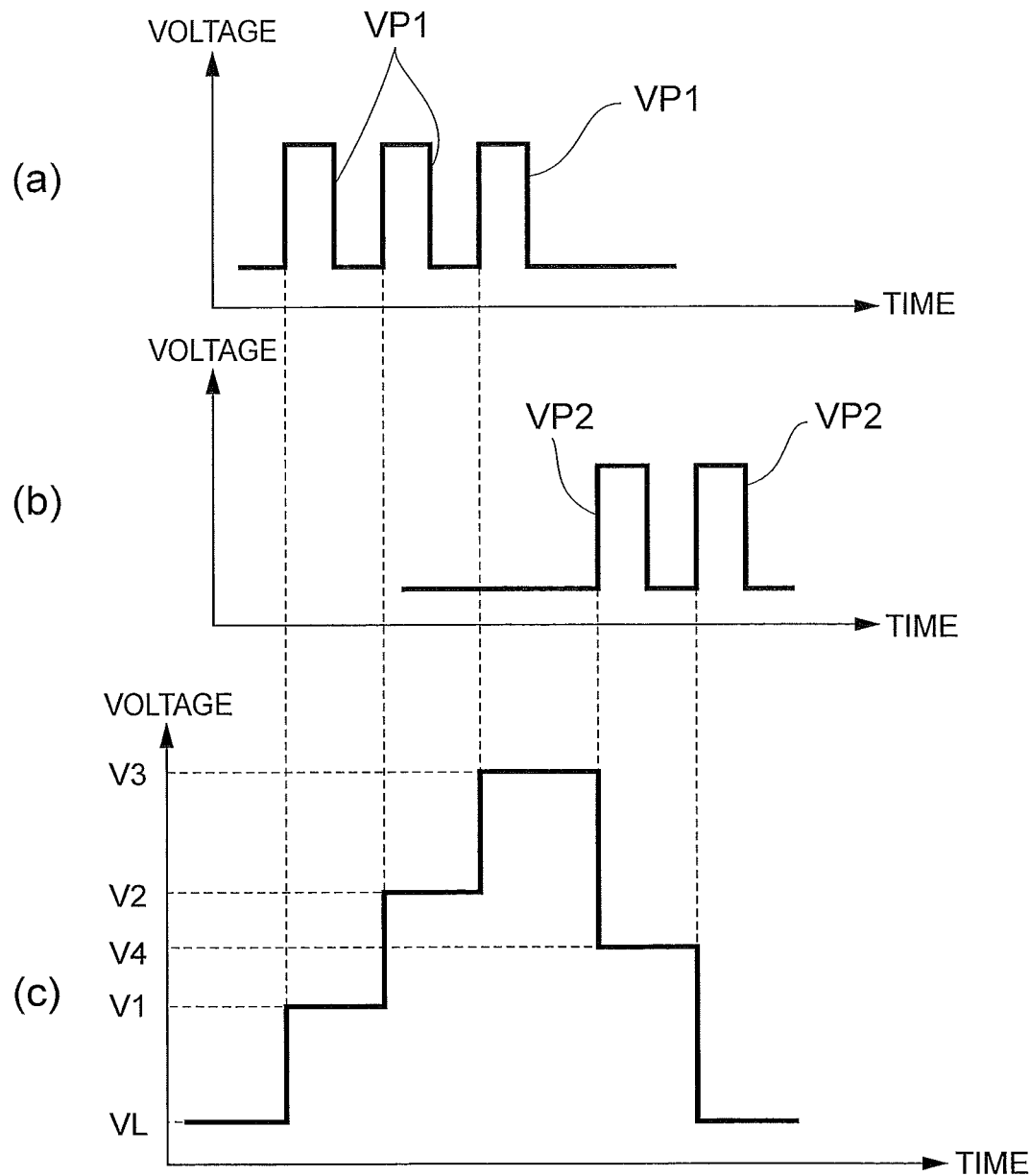
FIG. 5 includes diagrams showing (a) a temporal waveform of a voltage to be input to a first input terminal, (b) a temporal waveform of a voltage to be input to a second input terminal, and (c) a temporal waveform of a voltage at an output terminal.

FIG. 4 is a diagram schematically showing the operation of the capacitive load driving circuit 1A in a staircase wave generating mode. Further, (a) in FIG. 5 shows a temporal waveform of a voltage to be input to the input terminal 12a, (b) in FIG. 5 shows a temporal waveform of a voltage to be input to the input terminal 12b, and (c) in FIG. 5 shows a temporal waveform of a voltage at the output terminal 11. In addition, in FIG. 4, one or a plurality of FETs 21 and 31 are schematically shown as one switch. Further, in (a) in FIG. 5 to (c) in FIG. 5, the horizontal axis shows the time, and the scales thereof are matched in the respective drawings. On the other hand, the vertical axis shows the voltage, and the scales thereof are not necessarily matched in the respective drawings. In particular, the voltages at the output terminal 11 shown in (c) in FIG. 5 are much higher than the voltages at the input terminals 12a and 12b shown in (a) in FIG. 5 and (b) in FIG. 5.

In the staircase wave generating mode, the peak voltages of the pulsed voltages VP1 and VP2 are set to low values which are higher than or equal to the gate threshold voltages of the first and second FETs 21 and 31, thereby limiting an amount of current per pulse. Then, electric charges are charged and discharged little by little plural times for one electrode of the capacitive load 52, to generate a staircase wave pulse.

In detail, as shown in (a) in FIG. 5, first, the pulsed voltages VP1 are input plural times (three times in (a) in FIG. 5) from the pulsed voltage generating circuit 54. In the first switching circuit 20, the first FET 21 is brought into an on-state plural times according to these pulsed voltages VP1, and currents I11 to I13 at levels proportional to the peak voltage values of the pulsed voltages VP1 are supplied to the capacitive load 52 only for a time which is the same as a time width of the pulsed voltage VP1, to be accumulated in one electrode of the capacitive load 52. At this time, as shown in (c) in FIG. 5, the voltage values output from the output terminal 11 (i.e., the electrode potentials of the capacitive load 52) are to indicate values corresponding to products of the levels of the currents I11 to I13 and the time widths thereof. In detail, first, when the pulsed voltage VP1 of the first time is input, a voltage value at the output terminal 11 becomes a voltage value V1 that a voltage value corresponding to a product of the level of the current I11 and the time width thereof is added to the voltage value VL. Next, when the pulsed voltage VP1 of the second time is input after a predetermined time interval, a voltage value at the output terminal 11 becomes a voltage value V2 that a voltage value corresponding to a product of the level of the current I12 and the time width thereof is added to the voltage value V1. Then, when the pulsed voltage VP1 of the third time is further input after a predetermined time interval, a voltage value at the output terminal 11 becomes a voltage value V3 that a voltage value corresponding to a product of the level of the current I13 and the time width thereof is added to the voltage value V2. In addition, it is preferable that the voltage value V3 serving as a peak voltage of the staircase wave pulse is approximate to a difference in potential between the voltage VH and the voltage VL (that is, the capacitive load 52 is saturated).

Thereafter, as shown in (b) in FIG. 5, the pulsed voltages VP2 are input plural times (two times in (a) in FIG. 5) from the pulsed voltage generating circuit 54. In the second switching circuit 30, the second FET 31 is brought into an on-state plural times according to these pulsed voltages VP2, and currents I21 and I22 at levels proportional to the peak voltage values of the pulsed voltages VP2 flow out of the capacitive load 52 only for a time which is the same as a time width of the pulsed voltage VP2. At this time, as shown in (c) in FIG. 5, the voltage values at the output terminal 11 are to indicate values corresponding to products of the levels of the currents I21 and I22 and the time widths thereof. In detail, first, when the pulsed voltage VP2 of the first time is input, a voltage value at the output terminal 11 becomes a voltage value V4 that a voltage value corresponding to a product of the level of the current I21 and the time width thereof is subtracted from the voltage value V3 mentioned above. Next, when the pulsed voltage VP2 of the second time is input after a predetermined time interval, a voltage value at the output terminal 11 becomes a voltage value (for example, the same value as the VL) that a voltage value corresponding to a product of the level of the current I22 and the time width thereof is subtracted from the voltage value V4.

<Square Wave Generating Mode>

Figure 6:
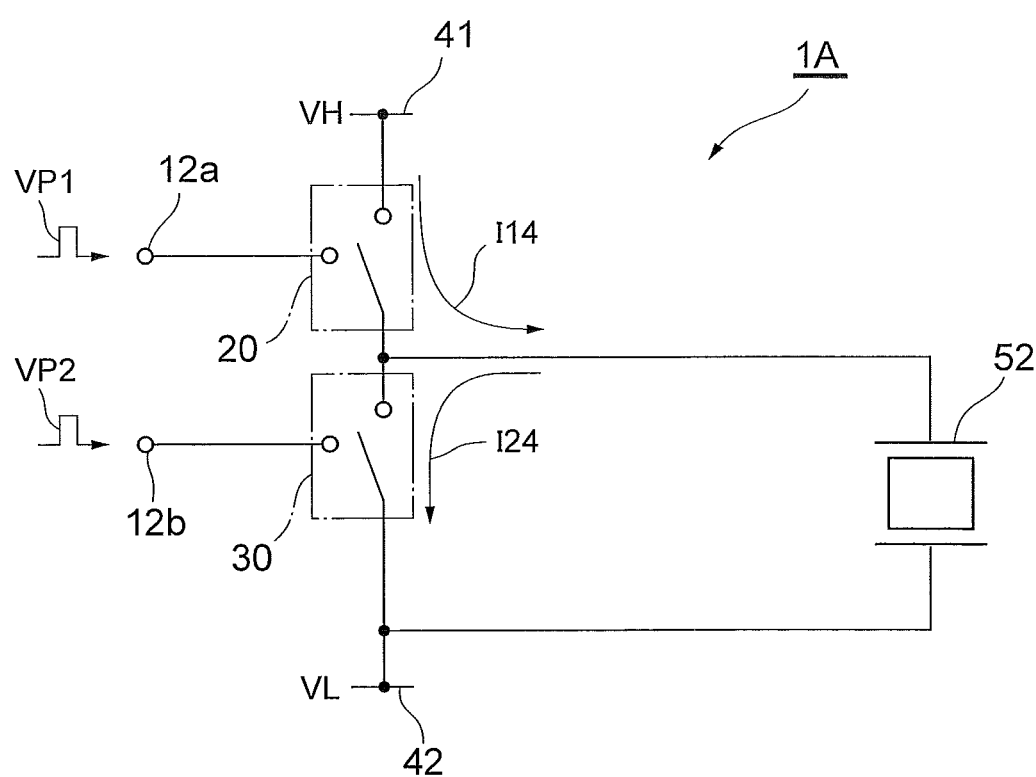
FIG. 6 is a diagram schematically showing the operation of the capacitive load driving circuit in a square wave generating mode.
Figure 7:
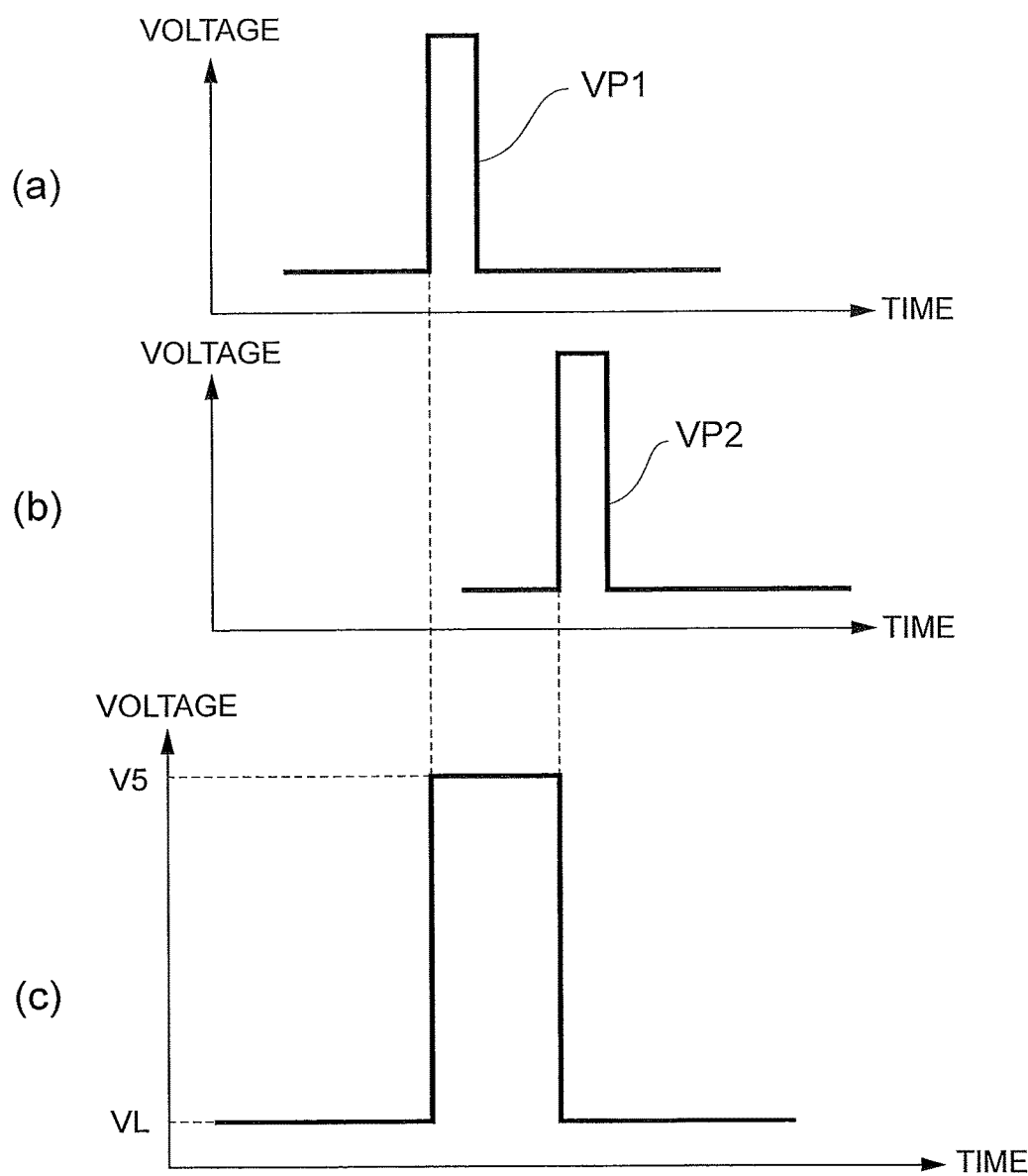
FIG. 7 includes diagrams showing (a) a temporal waveform of a voltage to be input to the first input terminal, (b) a temporal waveform of a voltage to be input to the second input terminal, and (c) a temporal waveform of a voltage at the output terminal.

FIG. 6 is a diagram schematically showing the operation of the capacitive load driving circuit 1A in a square wave generating mode. Further, (a) in FIG. 7 shows a temporal waveform of a voltage to be input to the input terminal 12a, (b) in FIG. 7 shows a temporal waveform of a voltage to be input to the input terminal 12b, and (c) in FIG. 7 shows a temporal waveform of a voltage at the output terminal 11. In addition, in FIG. 6 as well, one or a plurality of FETs are schematically shown as one switch. Further, the relationship between the horizontal axes and the vertical axes in (a) in FIG. 7 to (c) in FIG. 7 is in the same manner as that in (a) in FIG. 5 to (c) in FIG. 5.

In the square wave generating mode, the peak voltages of the pulsed voltages VP1 and VP2 are set to high values which are higher than or equal to the gate threshold voltages of the first and second FETs 21 and 31, and the charge and discharge of the capacitive load 52 are respectively completed by one-time pulse, thereby generating a square wave having high-speed rising and falling characteristics.

In detail, as shown in (a) in FIG. 7, first, the pulsed voltage VP1 is input only once from the pulsed voltage generating circuit 54. In the first switching circuit 20, the first FET 21 is brought into an on-state only once according to this pulsed voltage VP1, and a current I14 at a level proportional to the peak voltage value of the pulsed voltage VP1 is supplied to the capacitive load 52 only for a time which is the same as a time width of the pulsed voltage VP1, to be accumulated in one electrode of the capacitive load 52. At this time, as shown in (c) in FIG. 7, the voltage value at the output terminal 11 (i.e., the electrode potential of the capacitive load 52) is to indicate a value corresponding to a product of the level of the current I14 and the time width thereof. In detail, when the pulsed voltage VP1 is input, a voltage value at the output terminal 11 becomes a voltage value V5 that a voltage value corresponding to a product of the level of the current I14 and the time width thereof is added to the voltage value VL.

Thereafter, as shown in (b) in FIG. 7, the pulsed voltage VP2 is input only once from the pulsed voltage generating circuit 54. In the second switching circuit 30, the second FET 31 is brought into an on-state only once according to this pulsed voltage VP2, and a current I24 at a level proportional to the peak voltage value of the pulsed voltage VP2 flows out of the capacitive load 52 only for a time which is the same as a time width of the pulsed voltage VP2. At this time, as shown in (c) in FIG. 7, the voltage value at the output terminal 11 is to indicate a value corresponding to a product of the level of the current I24 and the time width thereof. In detail, when the pulsed voltage VP2 is input, a voltage value at the output terminal 11 becomes a voltage value (for example, the same value as the VL) that a voltage value corresponding to a product of the level of the current I24 and the time width thereof is subtracted from the voltage value V5 mentioned above.

In the staircase wave generating mode and the square wave generating mode described above, currents at levels corresponding to the peak voltages of the input pulsed voltages VP1 and VP2 flow in the first FET 21 and the second FET 31. More precisely, because the levels of the peak voltages of the pulsed voltages VP1 and VP2 are transformed by the first transformer 22 and the second transformer 32, currents at levels corresponding to the peaks of those transformed pulsed voltages flow in the first FET 21 and the second FET 31. Then, the peak voltages of the pulsed voltages VP1 and VP2 and the ratios of transformation of the first transformer 22 and the second transformer 32 are set such that the levels of the transformed pulsed voltages are higher than or equal to the respective gate threshold voltages of the first FET 21 and the second FET 31.

Figure 8:
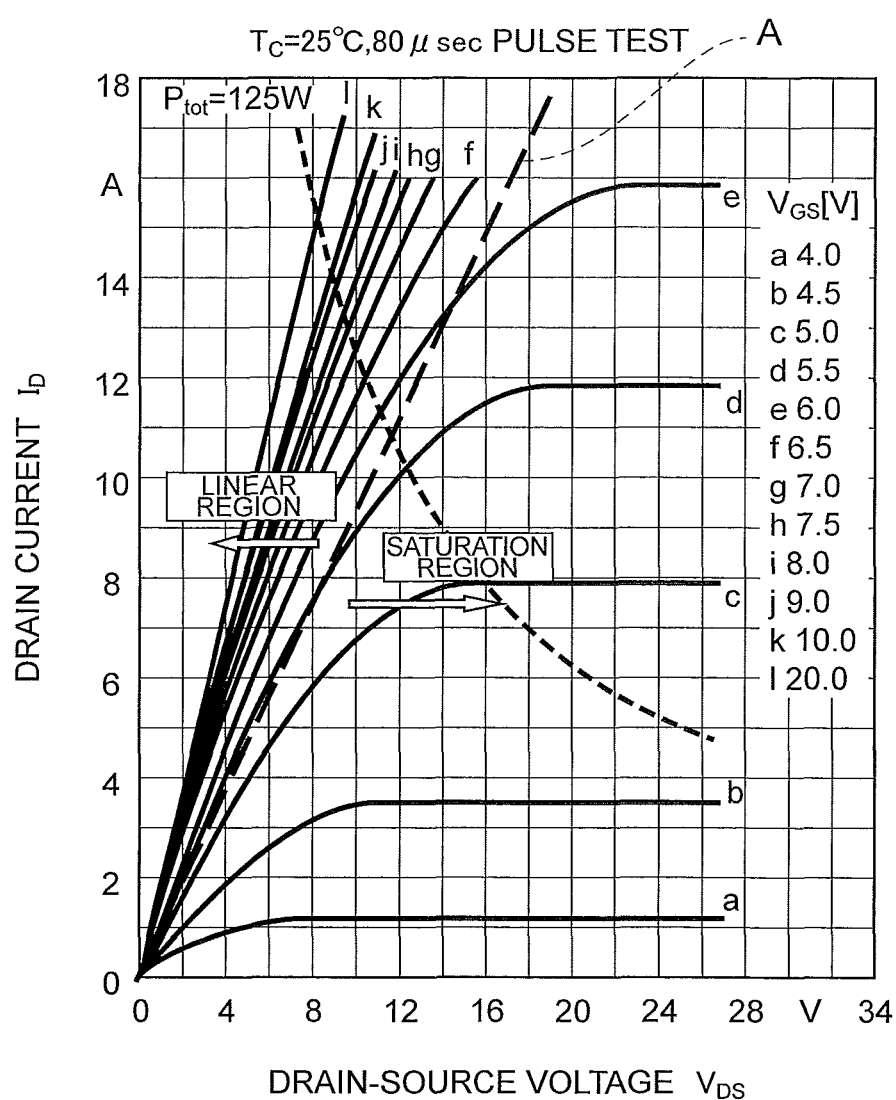
FIG. 8 is a diagram showing the I-V output characteristics of a general FET.

Here, FIG. 8 is a diagram showing the I-V output characteristics of a general FET. In FIG. 8, the horizontal axis shows the drain-source voltage values, and the vertical axis shows the drain current values. Further, in the drawing, graphs a to l are graphs showing the operating characteristics in the case where the gate-source voltage values are values shown in the drawing.

As shown in FIG. 8, on the graphs f to l with relatively high gate-source voltage values, the drain current values are substantially proportional to the drain-source voltage values. Such an operation region is called a linear region. On the other hand, on the graphs a to e with relatively low gate-source voltage values, it is understood that, after reaching certain values, the drain current values are substantially constant to be saturated regardless of the drain-source voltage values. Such an operation region is called a saturation region. In addition, the dashed line A in the drawing shows the boundary between a linear region and a saturation region.

In the present embodiment, the first FET 21 and the second FET 31 always operate in the saturation region. That is, because a difference in potential between the voltage VH of the first high-voltage power source 41 and the voltage VL of the second high-voltage power source 42 (VH-VL) is much higher than the gate-source voltage, the drain-source voltage values are always higher than the value shown by the dashed line A in the drawing during operations of the capacitive load driving circuit 1A. Accordingly, in the first FET 21 and the second FET 31, levels of drain currents are determined depending only on the gate-source voltage values regardless of the drain-source voltage values, and the more the gate-source voltage value increases, the more the drain current value increases (refer to the graphs a to e in the drawing). Then, such an operation in the saturation region enables the staircase wave generating mode described above.

Figure 9:
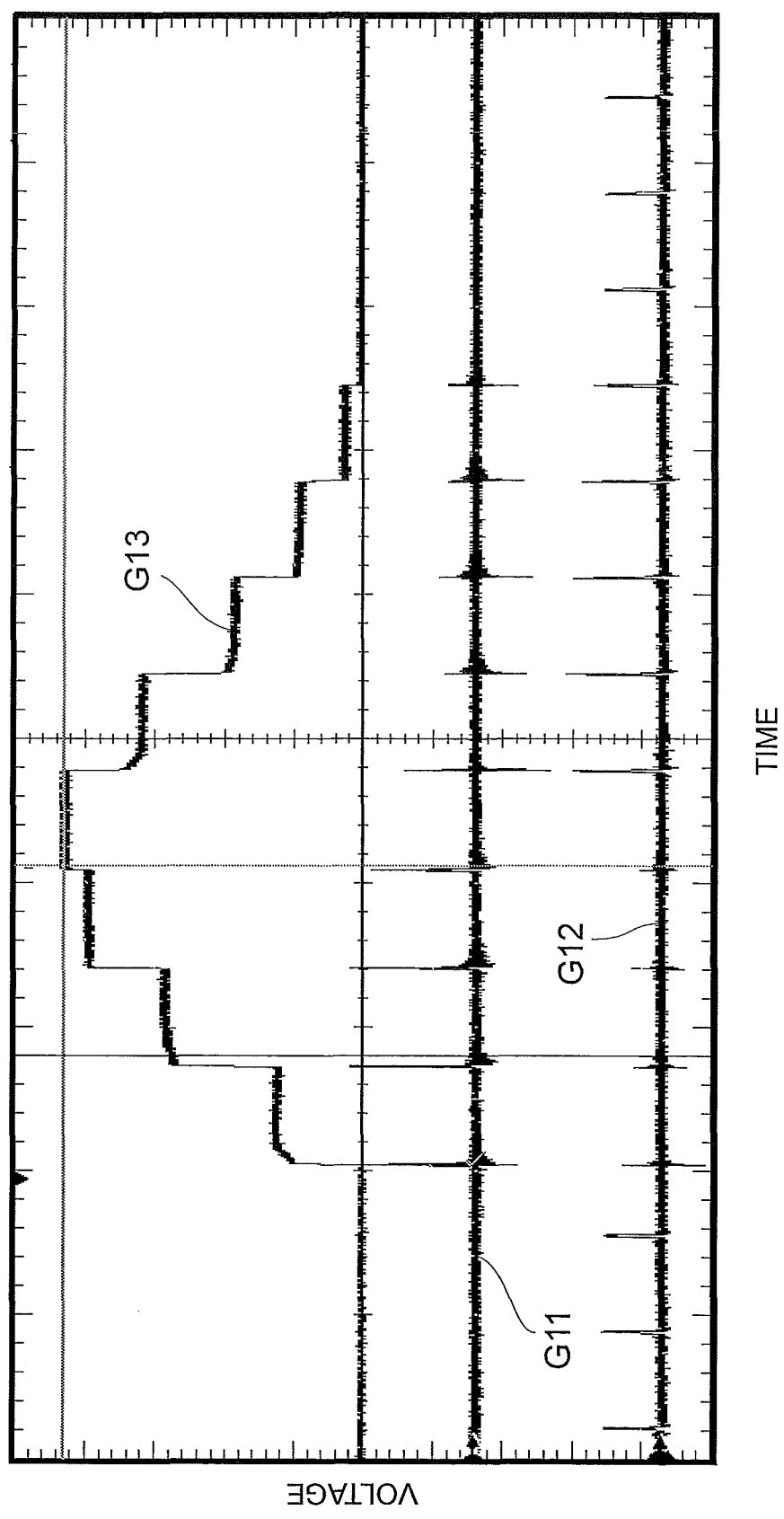
FIG. 9 is a graph showing the measurement result of a staircase wave pulse actually generated by the circuit shown in FIG. 3.

Effects obtained by the capacitive load driving circuit 1A described above will be described. FIG. 9 is a graph showing the measurement result of a staircase wave pulse actually generated by the circuit shown in FIG. 3. In addition, in this measurement, the voltage VH of the first high-voltage power source 41 is set to +1.5 kV, and the voltage VL of the second high-voltage power source 42 is set to −1.5 kV. Further, the levels (peak voltage values) of the pulsed voltages VP1 and VP2 are set to 5.5 V, the time widths are set to 22 nanoseconds, and the input intervals are set to 1 microsecond. In FIG. 9, a graph G11 shows a waveform of the pulsed voltage VP1, a graph G12 shows a waveform of the pulsed voltage VP2, and a graph G13 shows a waveform of the output voltage. In addition, the pulses appearing to be oscillating both in the positive voltage direction and the negative voltage direction are radiation noise accompanied by high-voltage switching.

As shown in FIG. 9, in accordance with the capacitive load driving circuit 1A of the present embodiment, it is possible to suitably generate a high-voltage staircase wave pulse in which the respective steps continue one microsecond by one microsecond.

In addition, by changing the levels and the time widths of the pulsed voltages VP1 and VP2, it is possible to change the amounts of changes in voltage at the respective steps of the staircase wave pulse. Further, by changing the input intervals of the pulsed voltages VP1 and VP2, it is also possible to change the durations of the respective steps of the staircase wave pulse. Accordingly, by lowering the peak voltage values of the pulsed voltages VP1 and VP2, and shortening the input intervals of the pulsed voltages VP1 and VP2, it is also possible to realize a sufficiently smooth high-voltage waveform. Further, by heightening the peak voltage values of the pulsed voltages VP1 and VP2 to, for example, 24V, it is also possible to generate a high-voltage single pulse of extremely high speed in rising and falling in the square wave generating mode.

Further, in the capacitive load driving circuit 1A shown in FIG. 3, the first switching circuit 20 has the plurality of first FETs 21 which are connected in series to one another, and the second switching circuit 30 has the plurality of second FETs 31 which are connected in series to one another. In accordance with this, it is possible to improve the voltage-resistant performances of the first and second switching circuits, and therefore, it is possible to apply an output voltage higher than that in the first embodiment to the capacitive load 52.

Figure 10:
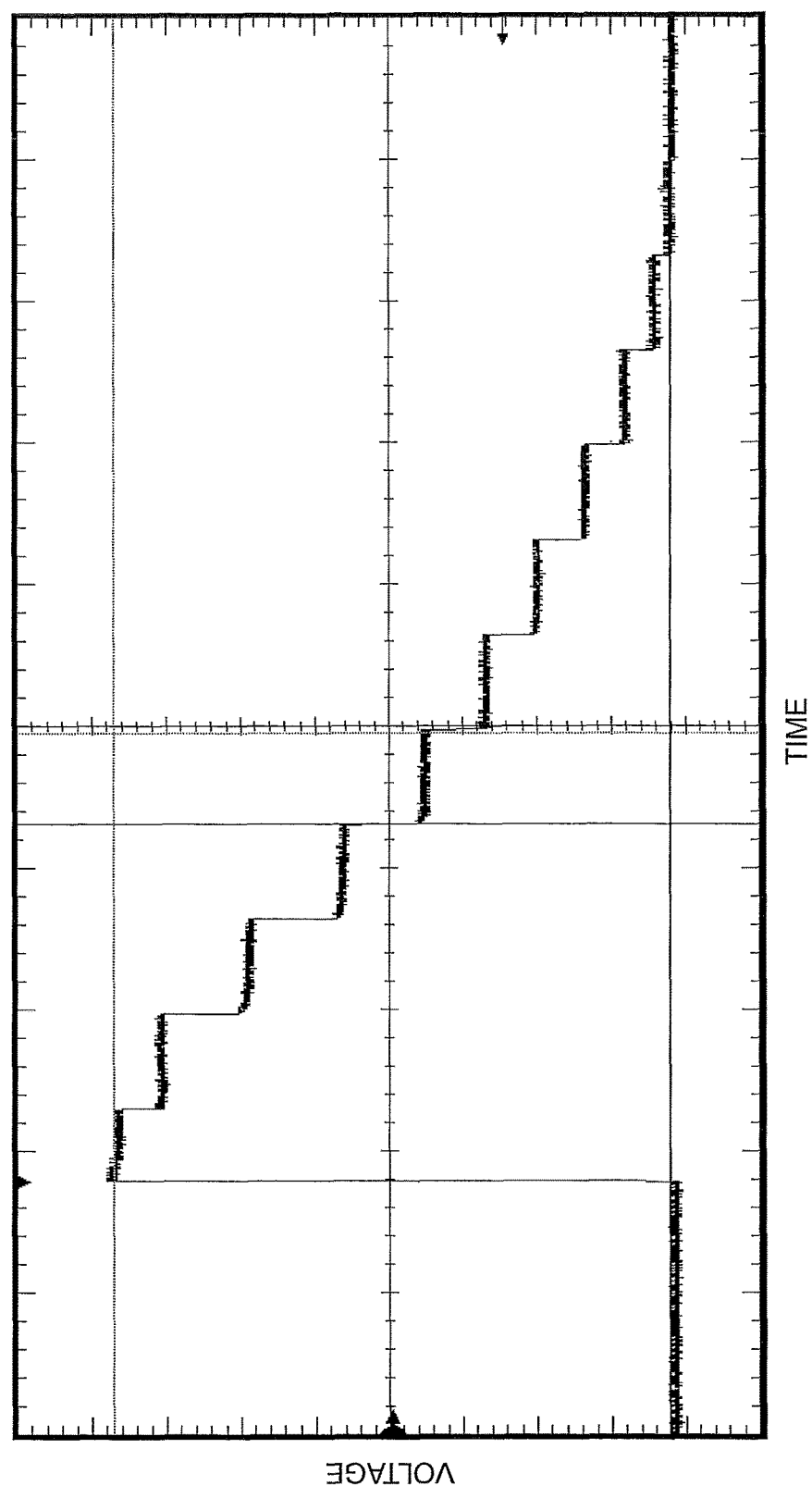
FIG. 10 is a graph showing an example of a staircase wave pulse output in the case of a stair-shaped voltage waveform only during voltage lowering.

In addition, in the present embodiment, in the staircase wave generating mode, pulsed voltages are input plural times both during voltage rising and voltage lowering of the output voltage value from the output terminal 11, to make the voltage waveform stair-shaped. The present embodiment is not limited to this example, and, for example, the first pulsed voltages may be input plural times during voltage rising, and the second pulsed voltage may be input only once during voltage lowering, thereby making a stair-shaped voltage waveform only during voltage rising. Or, the first pulsed voltage may be input only once during voltage rising, and the second pulsed voltages may be input plural times during voltage lowering, thereby making a stair-shaped voltage waveform only during voltage lowering. FIG. 10 is a graph showing an example of a staircase wave pulse output in the case of a stair-shaped voltage waveform only during voltage lowering.

Further, in the present embodiment, the first high-voltage power source 41 is exemplified as a first constant potential line, the first high-voltage power source 41 (voltage VH) is exemplified as a first constant potential line, and the second high-voltage power source 42 (voltage VL) is exemplified as a second constant potential line, however, any one of the first and second constant potential lines may be a reference potential line (ground potential line).

Second Embodiment

Figure 11:
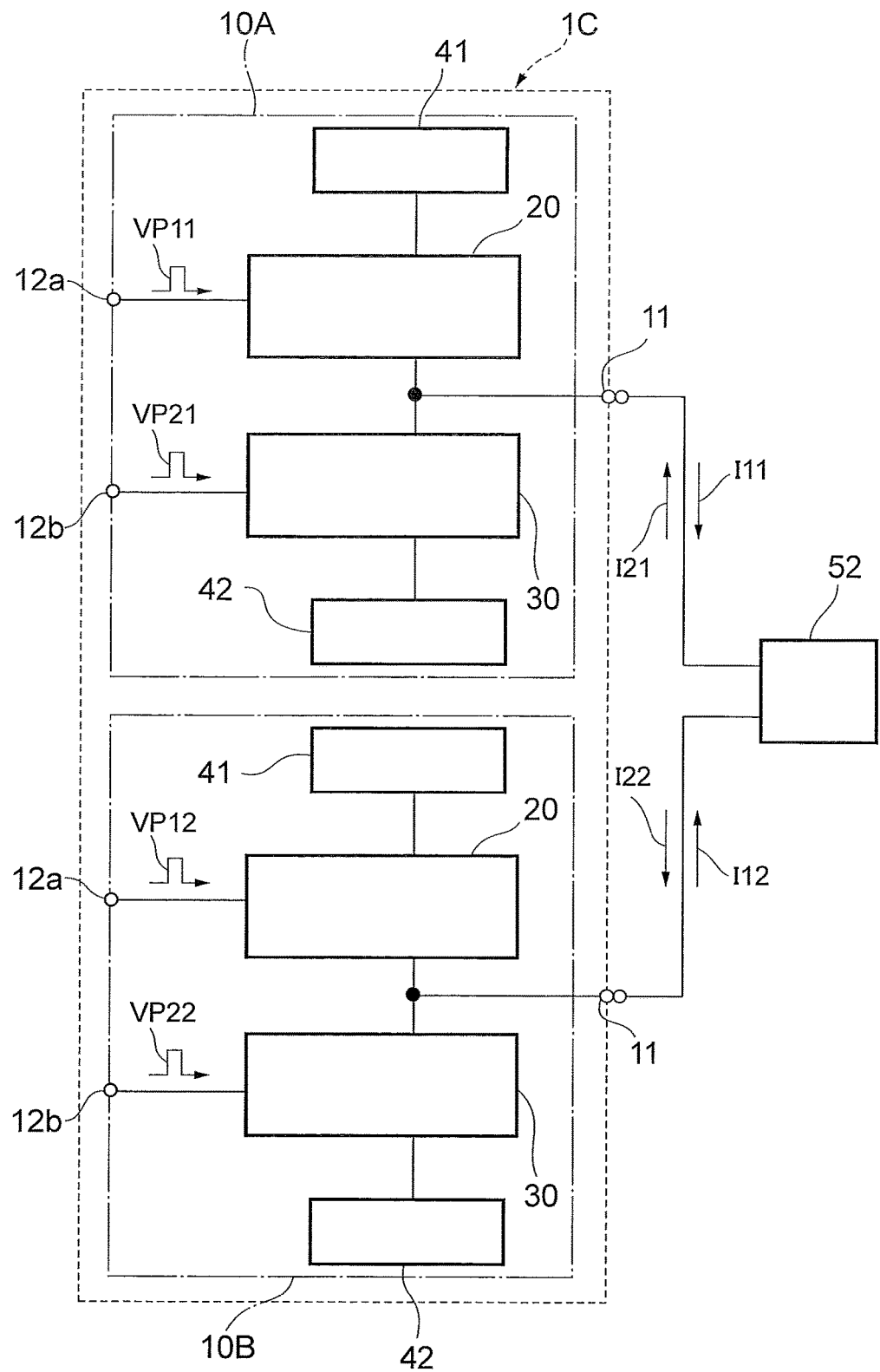
FIG. 11 is a diagram schematically showing a configuration of a capacitive load driving circuit according to a second embodiment.

FIG. 11 is a diagram schematically showing a configuration of a capacitive load driving circuit 1C according to a second embodiment of the present invention. As shown in FIG. 11, the capacitive load driving circuit 1C of the present embodiment includes two driving circuits of a first driving circuit 10A and a second driving circuit 10B. These driving circuits 10A and 10B have the same configuration of the capacitive load driving circuit 1A according to the first embodiment. That is, the driving circuits 10A and 10B each has the first switching circuit 20, the second switching circuit 30, the first high-voltage power source 41, and the second high-voltage power source 42. Further, the driving circuits 10A and 10B each has the output terminal 11, and the input terminals 12a and 12b.

In the present embodiment, pulsed voltages VP11 and VP21 are input from the pulsed voltage generating circuit (refer to FIG. 1) to the input terminals 12a and 12b of the driving circuit 10A. Further, independent of this, pulsed voltages VP12 and VP22 are input from the pulsed voltage generating circuit to the input terminals 12a and 12b of the driving circuit 10B. The output terminal 11 of the driving circuit 10A is connected to one electrode of the capacitive load 52, and the output terminal 11 of the driving circuit 10B is connected to the other electrode of the capacitive load 52. The driving circuit 10A supplies a current I11 at a level corresponding to a peak voltage of the pulsed voltage VP11 to the one electrode of the capacitive load 52, and causes a current I21 at a level corresponding to a peak voltage of the pulsed voltage VP21 to flow out of the one electrode of the capacitive load 52, thereby providing a staircase wave-shaped (or square wave-shaped) output voltage to the one electrode of the capacitive load 52. Further, the driving circuit 10B supplies a current I12 at a level corresponding to a peak voltage of the pulsed voltage VP12 to the other electrode of the capacitive load 52, and causes a current I22 at a level corresponding to a peak voltage of the pulsed voltage VP22 to flow out of the other electrode of the capacitive load 52, thereby providing a staircase wave-shaped (or square wave-shaped) output voltage to the other electrode of the capacitive load 52.

In this way, in the present embodiment, staircase wave-shaped (or square wave-shaped) voltages are individually provided to both the pair of electrodes of the capacitive load 52, thereby applying the staircase wave-shaped (or square wave-shaped) voltages to the entire capacitive load 52. In accordance with this capacitive load driving circuit 1C, it is possible to exert the effects which are the same as those in the first embodiment, and it is possible to increase (for example, double) an amount of changes in voltage between the both ends of the capacitive load 52 more than those in the first embodiment and the second embodiment.

Third Embodiment

Figure 12:
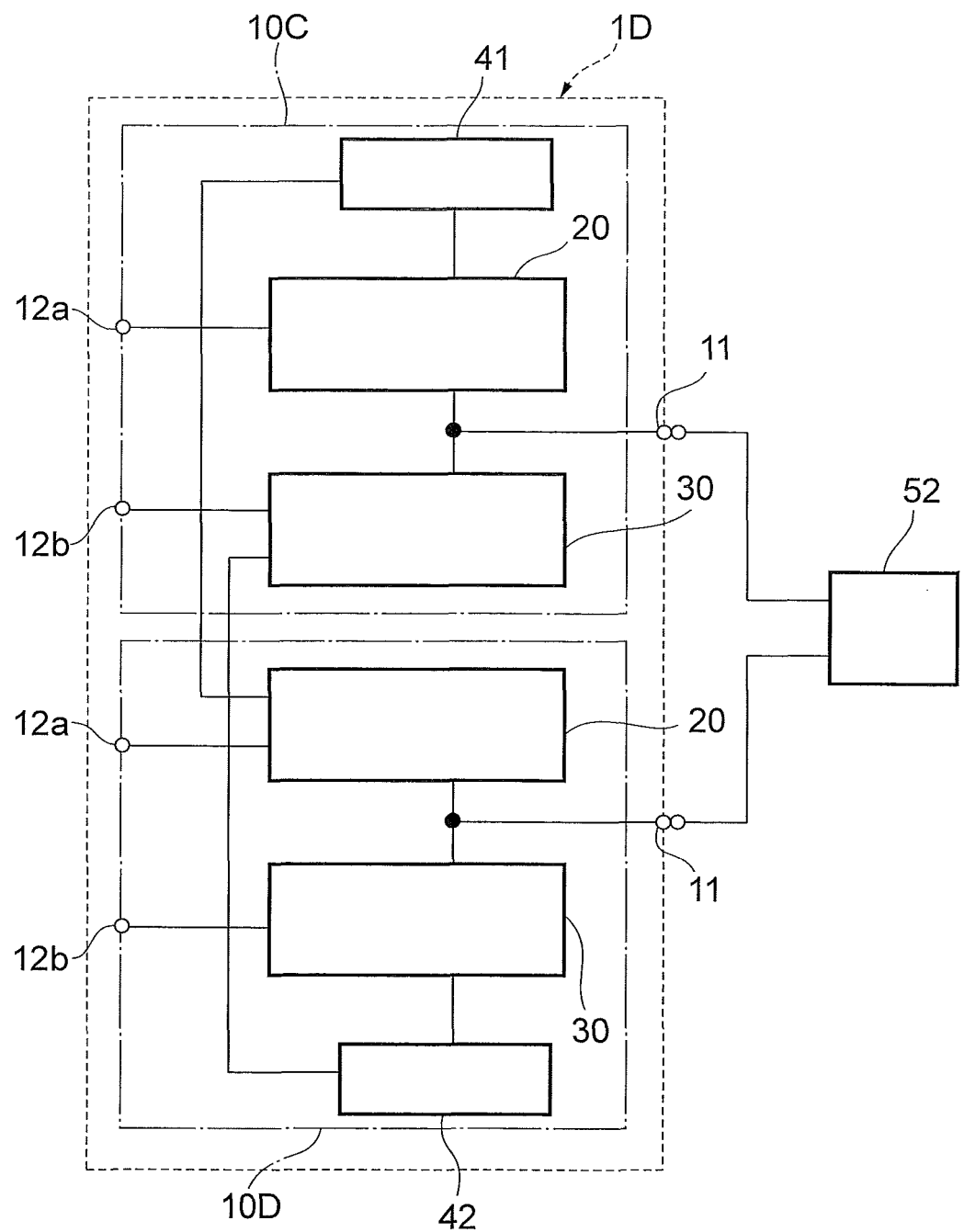
FIG. 12 is a diagram schematically showing a configuration of a capacitive load driving circuit according to a third embodiment.

FIG. 12 is a diagram schematically showing a configuration of a capacitive load driving circuit 1D according to a third embodiment of the present invention. The capacitive load driving circuit 1D of the present embodiment includes, in the same manner as the capacitive load driving circuit 1C according to the second embodiment, two driving circuits of a first driving circuit 10C and a second driving circuit 10D. However, in the present embodiment, the second driving circuit 10D does not include the first high-voltage power source 41, and is configured to use the first high-voltage power source 41 of the first driving circuit 10C in common. Further, the first driving circuit 10C does not include the second high-voltage power source 42, and is configured to use the second high-voltage power source 42 of the second driving circuit 10D in common.

In the case where the voltage VH of the first high-voltage power source 41 and the voltage VL of the second high-voltage power source 42 may be matched to one another in the first driving circuit 10C and the second driving circuit 10D, respectively, as in the capacitive load driving circuit 1D of the present embodiment, the first high-voltage power source 41 and the second high-voltage power source 42 may be used in common in the first driving circuit 10C and the second driving circuit 10D. Thereby, it is possible to further downsize the capacitive load driving circuit which provides a staircase wave-shaped (or square wave-shaped) voltage to both the pair of electrodes of the capacitive load 52.

Further, even in the case where the levels of the voltages VH and VL are different between the first driving circuit 10C and the second driving circuit 10D, it is possible to use the first high-voltage power source 41 and the second high-voltage power source 42 in common by performing voltage shift such as resistance voltage dividing. Further, in the present embodiment, the first driving circuit 10C and the second driving circuit 10D have the high-voltage power sources in common, however, the components in common are not limited to the high-voltage power sources. The first driving circuit 10C and the second driving circuit 10D have other various components in common, thereby it is possible to exert the operation and effect which are the same as those in the third embodiment, and it is possible to provide a capacitive load driving circuit which can be downsized.

Fourth Embodiment

Figure 13:
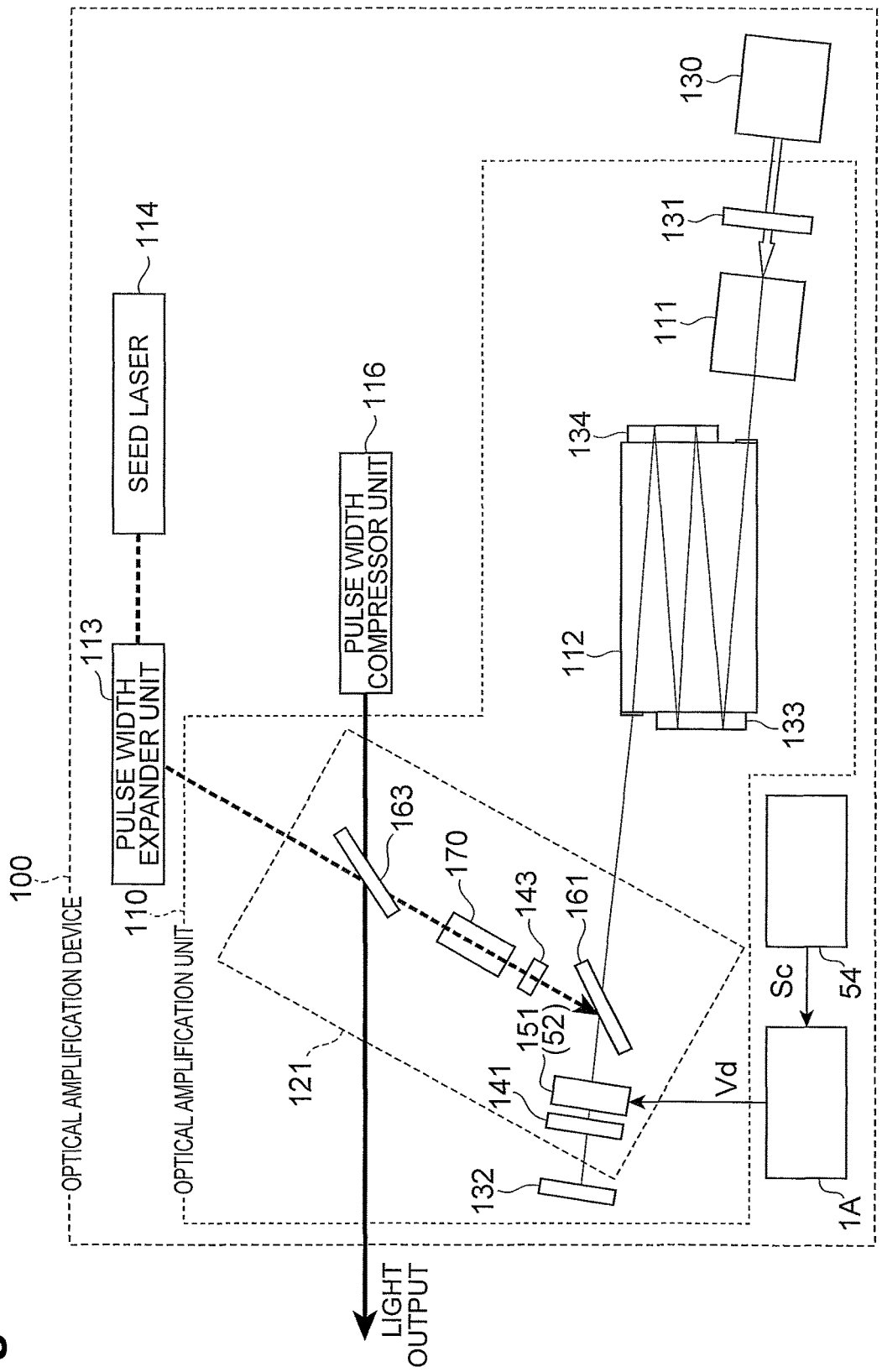
FIG. 13 is a configuration diagram of an optical amplification device including the capacitive load driving circuit of the first embodiment.

Next, an optical amplification device including the capacitive load driving circuit according to an embodiment of the present invention will be described as a fourth embodiment. FIG. 13 is a configuration diagram of an optical amplification device 100 including the capacitive load driving circuit 1A according to the first embodiment. The optical amplification device 100 according to the present embodiment includes an optical amplification unit 110, a pulse width expander unit 113, a seed laser (seed light source) 114, a pulse width compressor unit 116, an energy supply unit 130, the capacitive load driving circuit 1A, and the pulsed voltage generating circuit 54. The optical amplification unit 110 includes an optical amplifying medium 111, a transparent medium 112, mirrors 131 to 134, and light extracting means 121.

The mirror 131 has spectral transmission characteristics of reflecting pulsed light serving as light to be amplified, and of allowing excitation light output from the energy supply unit 130 to transmit through the mirror. The mirror 132 reflects pulsed light. The mirror 131 and the mirror 132 compose a Fabry-Perot type optical resonator. This optical resonator resonates pulsed light serving as light to be amplified. The optical amplifying medium 111 is disposed on the resonance optical path of this optical resonator, and is supplied with excitation light, to amplify the pulsed light. The energy supply unit 130 supplies excitation energy (for example, excitation light) to the optical amplifying medium 111.

In accordance with such a configuration including an optical resonator, it is possible to accumulate light. In this case, the optical amplification device 100 is configured to have a laser oscillation function which is capable of generating laser light due to laser oscillation caused in the optical resonator. As the optical amplifying medium 111, a gas such as He—Ne which is called a laser medium, a liquid in which dyes or the like are dissolved, or a solid such as Nd:YAG or Yb:YAG may be used.

The transparent medium 112, the light extracting means 121, and the mirrors 133 and 134 are further disposed on the resonance optical path between the mirror 131 and the mirror 132. The mirrors 133 and 134 are to reflect pulsed light, and are configured so as to be attached to the transparent medium 112, or so as to vapor-deposit mirrors onto the transparent medium 112, and propagate pulsed light in a zigzag manner in the transparent medium 112.

The transparent medium 112 is an optical component which allows pulsed light to be input therein, so as to be repeatedly reflected internally, and to thereafter output the pulsed light. The transparent medium 112 is capable of internally propagating pulsed light in a zigzag manner. By multiple reflection of the light in the transparent medium 112 with a refractive index higher than air, it is possible to lengthen an optical path length through which light to be amplified propagates in a limited space. Accordingly, when compared with the case of adopting a configuration in which light to be amplified propagates for the same distance in air, provided that pulsed light propagates in the transparent medium 112, it is possible to stably realize downsizing. By propagating pulsed light at an angle satisfying the total reflection conditions, it is also possible to realize the same operation without forming mirrors on the interfaces of the transparent medium 112.

The light extracting means 121 extracts pulsed light which has been optically-amplified for a given period in the optical resonator, to the outside of the optical resonator. In addition, the light extracting means 121 of the present embodiment has a function as light taking-in means for taking pulsed seed light into the resonance optical path from the seed laser 114 outside the optical resonator as well. The light extracting means 121 of the present embodiment includes wave plates 141 and 143, a light modulation element 151, polarizing beam splitters 161 and 163, and a Faraday rotator 170.

The wave plate 141, the light modulation element 151, and the polarizing beam splitter 161 are provided on the resonance optical path of the optical resonator of the optical amplification unit 110. The wave plate 143 and the Faraday rotator 170 are provided between the polarizing beam splitter 161 and the polarizing beam splitter 163. The light modulation element 151 is to control a polarization state of pulsed light, and corresponds to the capacitive load 52 in the aforementioned first to third embodiments. As the light modulation element 151 (capacitive load 52), an optical crystal (for example, a Pockels cell) having an electro-optic effect may be used. The polarizing beam splitters 161 and 163 selectively reflect pulsed light, or allow the pulsed light to transmit according to a polarization state of the pulsed light.

The light extracting means 121 controls a polarization state of the pulsed light with the light modulation element 151 (capacitive load 52), to amplify the seed light from the seed laser 114 in the optical resonator of the optical amplification unit 110, and output the light from the optical amplification unit 110 after the elapse of a certain period of time, thereby it is possible to generate amplified light. In a steady state, seed light reflected by the polarizing beam splitter 161 reciprocates through the wave plate 141 and the light modulation element 151, thereby changing its polarization 90 degrees. Therefore, because the seed light which has completed one reciprocation with the wave plate 141 and the light modulation element 151 transmits through the polarizing beam splitter 161, the light passes through the transparent medium 112 to reach the optical amplifying medium 111, and proceeds along the optical path in the opposite direction by the mirror 131, to return to the polarizing beam splitter 161 again. The seed light transmitting through the polarizing beam splitter 161 reciprocates through the wave plate 141 and the light modulation element 151, thereby changing its polarization 90 degrees, and therefore, the seed light is reflected on the polarizing beam splitter 161 this time, to be extracted to the outside of the optical resonator.

Here, provided that it is adjusted such that the polarization is not changed when certain seed light reciprocates through the wave plate 141 and the light modulation element 151 by modulating the light modulation element 151 at the timing in which the seed light transmits through the polarizing beam splitter 161, and passes through the transparent medium 112 to reach the optical amplifying medium 111, and proceeds along the optical path in the opposite direction by the mirror 131, to return to the polarizing beam splitter 161 again, it is possible to take in the seed light at this timing into the optical resonator of the optical amplification unit 110, and to thereafter cause pulsed light based on this seed light to reciprocate inside the optical resonator of the optical amplification unit 110. In addition, other seed light components are always to be reflected on the polarizing beam splitter 161, and not incident into the optical amplifying medium 111.

The light extracting means 121 is configured such that by bringing the state of the light modulation element 151 (capacitive load 52) back to the original state at a certain timing after the elapse of a certain period of time after taking in light, pulsed light reciprocates through the wave plate 141 and the light modulation element 151, thereby changing its polarization 90 degrees, and the light extracting means extracts the pulsed light to the outside of the optical resonator. In accordance with this, it is possible to generate amplified light of quality equal to the seed light and with high energy, and it is possible to suitably realize the regenerative amplification function for amplifying light.

The seed laser 114 periodically provides pulsed seed light with a pulse width shorter than a reciprocation time of light in the resonance optical path of the optical resonator to the optical amplification unit 110. This seed light has a wavelength which may be optically amplified by the optical amplifying medium 111. As the seed laser 114, for example, a mode-locked fiber laser light source is suitable.

The pulse width expander unit 113 expands a pulse width of pulsed seed light from the seed laser 114, and brings the expanded seed light to be input to the optical resonator of the optical amplification unit 110. In order to limit damage to the optical component by a high-intensity pulsed light, seed light temporally expanded by the pulse width expander unit 113 is taken into the optical amplification unit 110. For example, as the pulse width expander unit 113, a dispersing medium such as an optical fiber may be used, and further, a wavelength dispersion element such as a diffraction grating or a prism as well may be utilized. Here, when a dispersing medium is used as the transparent medium 112, because this transparent medium 112 has the same function as a pulse width expander unit, the pulse width expander unit 113 may be omitted.

The pulse width compressor unit 116 compresses a pulse width of pulsed light which is optically amplified to be output from the optical amplification unit 110, and outputs the compressed pulsed light. The pulsed light output from the pulse width compressor unit 116 has high peak power. (a) in FIG. 14 and (b) in FIG. 14 are diagrams showing configuration examples of the pulse width compressor unit 116.

A pulse width compressor unit 116a shown in (a) in FIG. 14 includes a turn-back mirror 117 and reflection-type diffraction gratings 118 and 119. The turn-back mirror 117 is a mirror that combines two planar mirrors such that the respective reflecting surfaces are at 90 degrees to one another, and the turn-back mirror is capable of reflecting incident light on one of the planar mirrors and thereafter reflects the light on the other planar mirror so as to emit the light. The respective optical paths of the incident light and the emitted light to and from the turn-back mirror 117 are parallel to one another, but not overlapped. The light input to this pulse width compressor unit 116a is spectrally dispersed by the reflection-type diffraction grating 118, their respective wavelength components are made parallel to one another by the reflection-type diffraction grating 119, their optical paths are reflexed by the turn-back mirror 117, and the respective wavelength components are condensed onto the reflection-type diffraction grating 118 by the reflection-type diffraction grating 119, to be multiplexed and output by the reflection-type diffraction grating 118. With use of the pulse width compressor unit 116a having such a configuration, it is possible to provide effectively negative group velocity dispersion to pulsed light.

A pulse width compressor unit 116b shown in (b) in FIG. 14 includes the turn-back mirror 117 and transmission-type diffraction gratings 128 and 129. The light input to this pulse width compressor unit 116b is spectrally dispersed by the transmission-type diffraction grating 128, their respective wavelength components are made parallel to one another by the transmission-type diffraction grating 129, their optical paths are reflexed by the turn-back mirror 117, and the respective wavelength components are condensed onto the transmission-type diffraction grating 128 by the transmission-type diffraction grating 129, to be multiplexed and output by the transmission-type diffraction grating 128. With use of the pulse width compressor unit 116b having such a configuration, it is possible to provide effectively negative group velocity dispersion to pulsed light. Further, because the transmission-type diffraction gratings are used in the pulse width compressor unit 116b, there is no need to apply high-reflective coating such as gold onto the surfaces as a reflection-type diffraction grating.

The capacitive load driving circuit 1A supplies a driving voltage Vd for controlling a polarization state of light to the light modulation element 151 (capacitive load 52) of the light extracting means 121. The driving voltage Vd is a staircase wave pulse or a square wave pulse shown in the above-described respective embodiments. In order for the light extracting means 121 to take in seed light from the seed laser 114 in a timely manner, the capacitive load driving circuit 1A receives a control signal Sc in synchronization with the timing in which the seed laser 114 outputs seed light (that is, the seed light is input to the optical amplification unit 110) from the pulsed voltage generating circuit 54, and outputs the driving voltage Vd at the timing corresponding to this control signal Sc. In the case where the driving voltage Vd is a staircase wave pulse, the control signal Sc is composed of a plurality of pulsed voltages VP1 and a plurality of pulsed voltages VP2. Further, in the case where the driving voltage Vd is a square wave pulse, the control signal Sc is composed of one pulsed voltage VP1 and one pulsed voltage VP2. The driving voltage Vd is a high-voltage pulse of a voltage of approximately 4 kV for example, with, for example, a repetition frequency of several kilohertz to several hundreds of kilohertz that several tens of megahertz which is a repetition frequency of seed light is frequency-divided.

The pulsed voltage generating circuit 54 receives a trigger signal in synchronization with the output timing of seed light from the seed laser 114. In addition, a trigger signal is obtained, for example, by performing photoelectric conversion of a part of seed light output from the seed laser 114 with a photodetector or the like. The pulsed voltage generating circuit 54 generates a control signal Sc for outputting the driving signal Vd in synchronization with the input timing of the seed light to the optical amplification unit 110 on the basis of this trigger signal, and provides the control signal to the capacitive load driving circuit 1A.

In the optical amplification device 100 having the above-described configuration, pulsed seed light at a repetition frequency of approximately several tens of megahertz is output from the seed laser 114. At the same time, a trigger signal based on this seed light is input to the pulsed voltage generating circuit 54. Then, the control signal Sc frequency-divided into several kilohertz to several hundreds of kilohertz is transmitted from the pulsed voltage generating circuit 54 to the capacitive load driving circuit 1A, and a staircase wave-shaped or a square wave-shaped driving voltage Vd is output from the capacitive load driving circuit 1A at the timing of this control signal Sc. The optical amplification unit 110 operates as an optical resonator only when this driving voltage Vd is applied to the light modulation element 151 (capacitive load 52). Further, when the driving voltage Vd is not applied to the light modulation element 151, energy is stored in the optical amplifying medium 111 by excitation light from the energy supply unit 130.

The driving voltage Vd is applied to the light modulation element 151 (capacitive load 52) at the timing in which seed light is to be taken into the optical resonator of the optical amplification unit 110. In accordance with this, the seed light is taken into the optical resonator. The seed light absorbs the energy of the optical amplifying medium 111 while resonating, and is gradually amplified to be pulsed light with a heightened peak power. After a certain period in which the pulsed light has been sufficiently amplified, the application of the driving voltage Vd to the light modulation element 151 (capacitive load 52) is stopped. In accordance with this, the pulsed light is extracted from the optical resonator.

Figure 15:
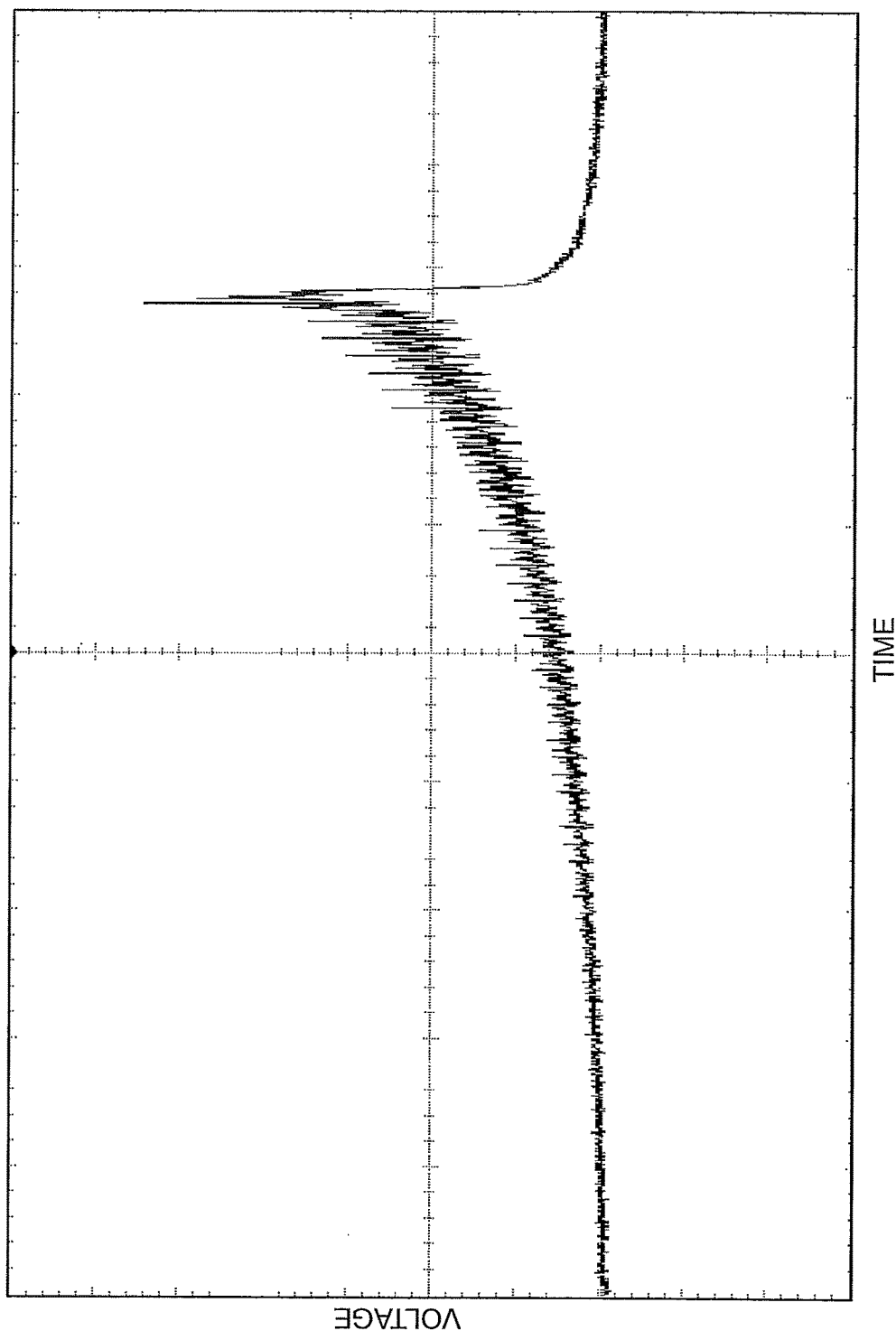
FIG. 15 is a graph showing an example of a waveform of a light pulse output from the optical amplification device.

In the optical amplification device 100 of the present embodiment which has been described above, as a circuit that drives the light modulation element 151, the capacitive load driving circuit 1A according to the first embodiment which is capable of generating a high-voltage stair-shaped pulse is used. In accordance with this, it is possible to temporally gradually change a Q value of the optical resonator, for causing cavity dumping oscillation. Then, the energy of a light pulse inside the optical resonator and the energy extracting efficiency to the outside of the optical resonator are controlled by utilizing such characteristics, thereby it is possible to freely change a waveform of a light pulse output from the optical amplification device 100 to some extent. FIG. 15 is a graph showing an example of a waveform of a light pulse output from the optical amplification device 100 in a layout in which seed light is not allowed to be incident. In FIG. 15, the horizontal axis shows the time (100 ns/div), and the vertical axis shows the signal voltage output from the photodetector. As shown in the drawing, in accordance with the optical amplification device 100 of the present embodiment, it is also possible to output pulsed light with a time width of sub-microseconds (for example, several hundreds of nanoseconds).

Figure 16:
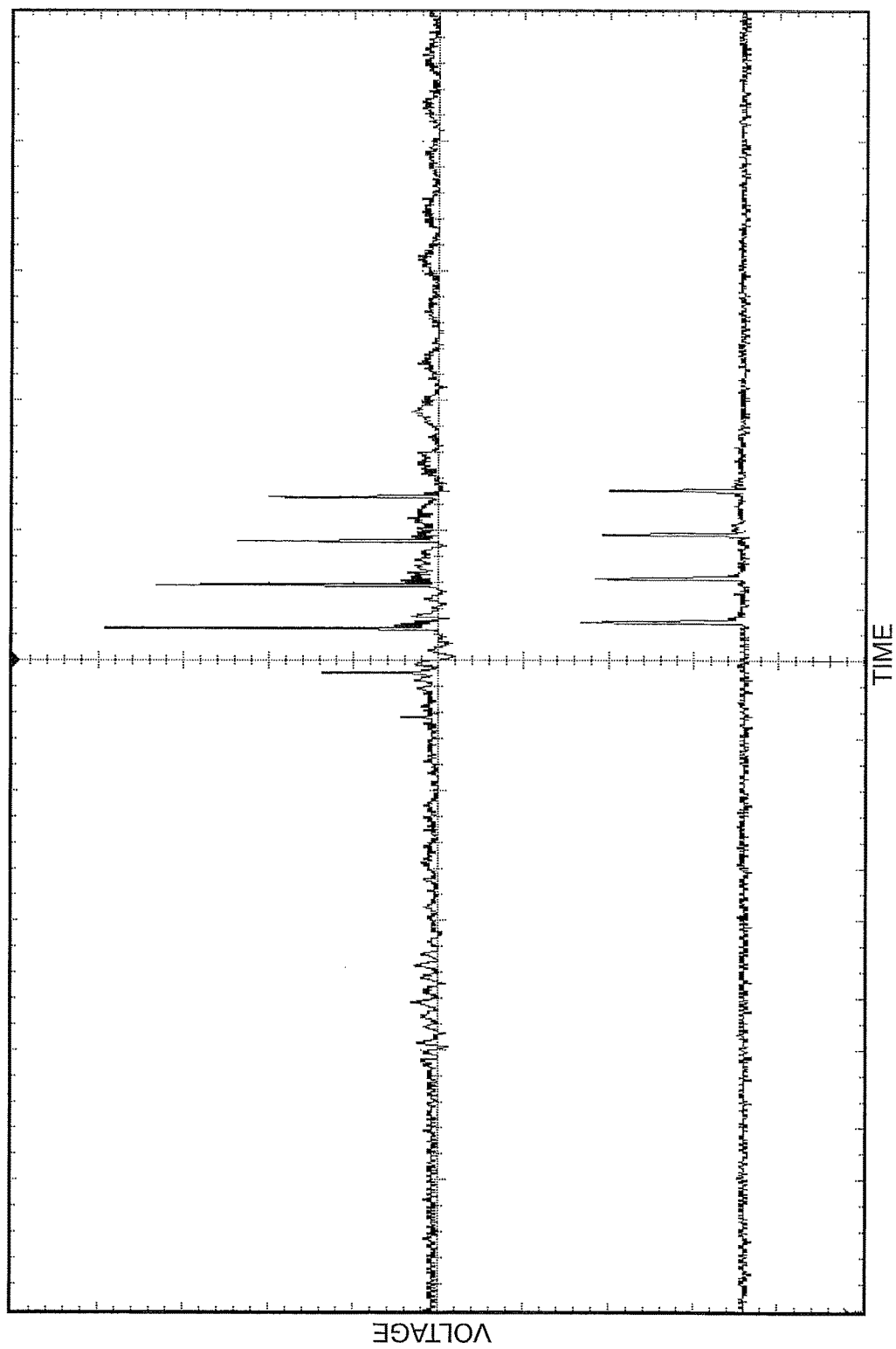
FIG. 16 is a graph showing an example of a pulse train output from the optical amplification device.
Figure 18:
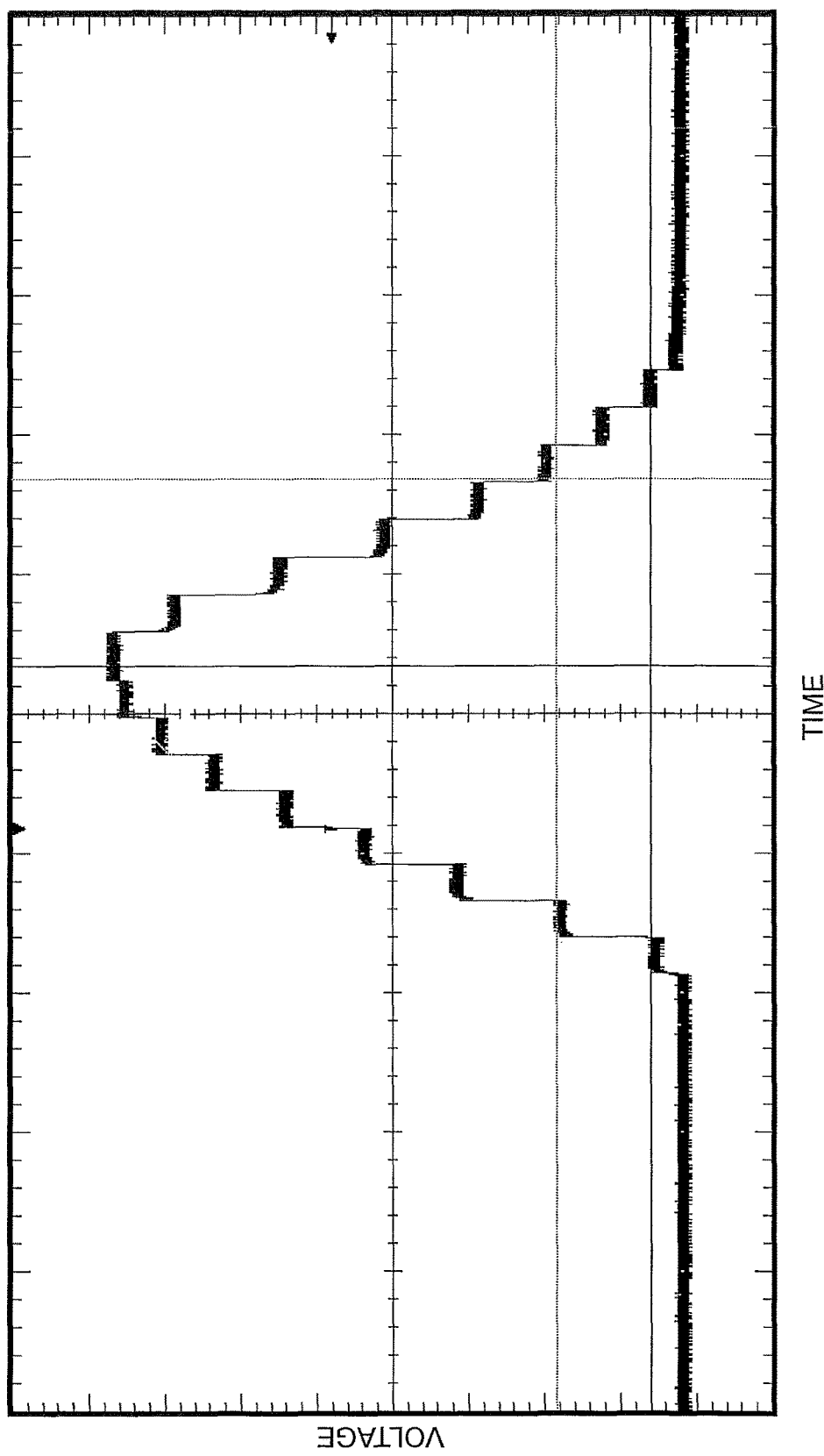
FIG. 18 is a graph showing a measured waveform of a staircase wave pulse output under the input condition (1) shown in FIG. 17.
Figure 19:
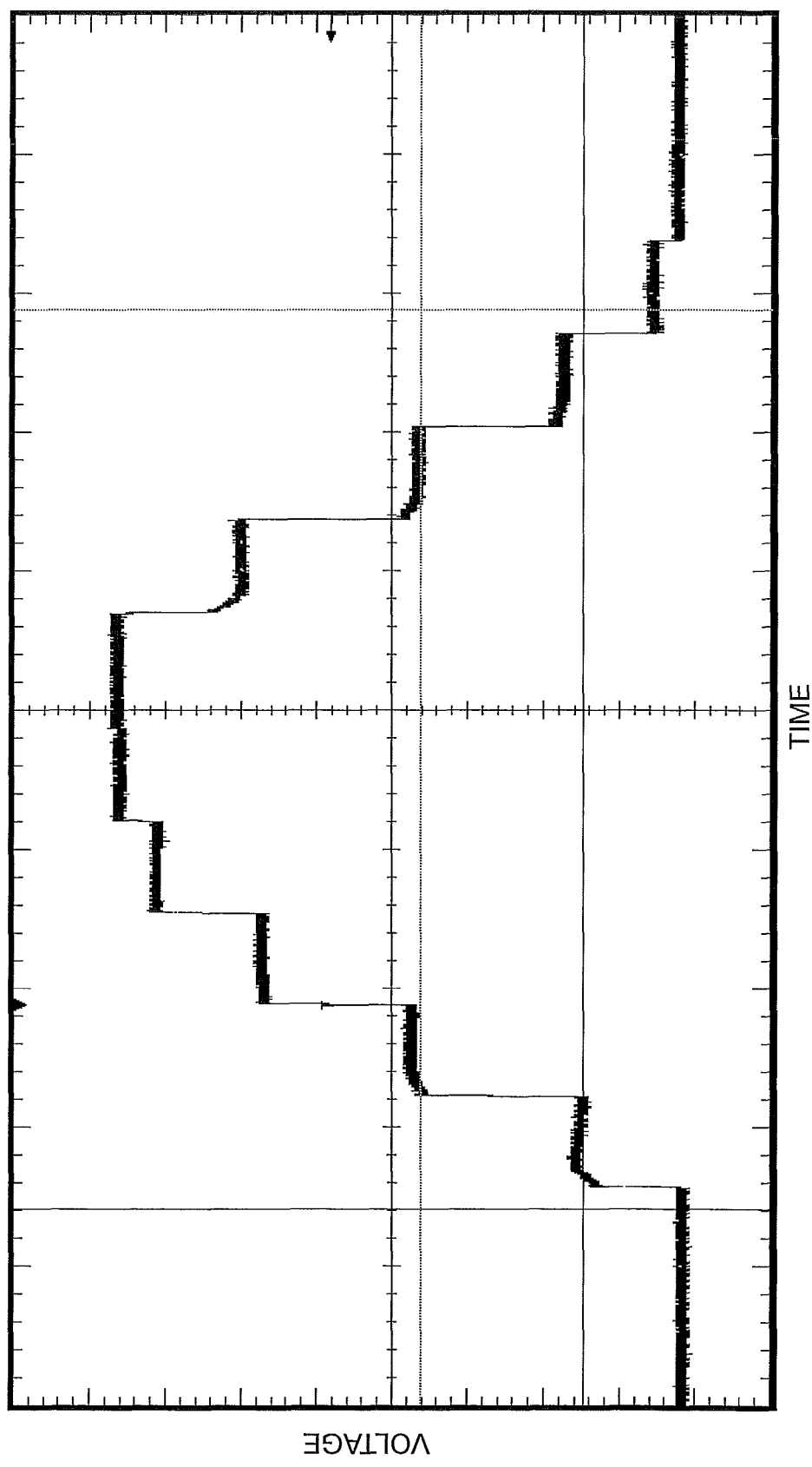
FIG. 19 is a graph showing a measured waveform of a staircase wave pulse output under the input condition (2) shown in FIG. 17.
Figure 20:
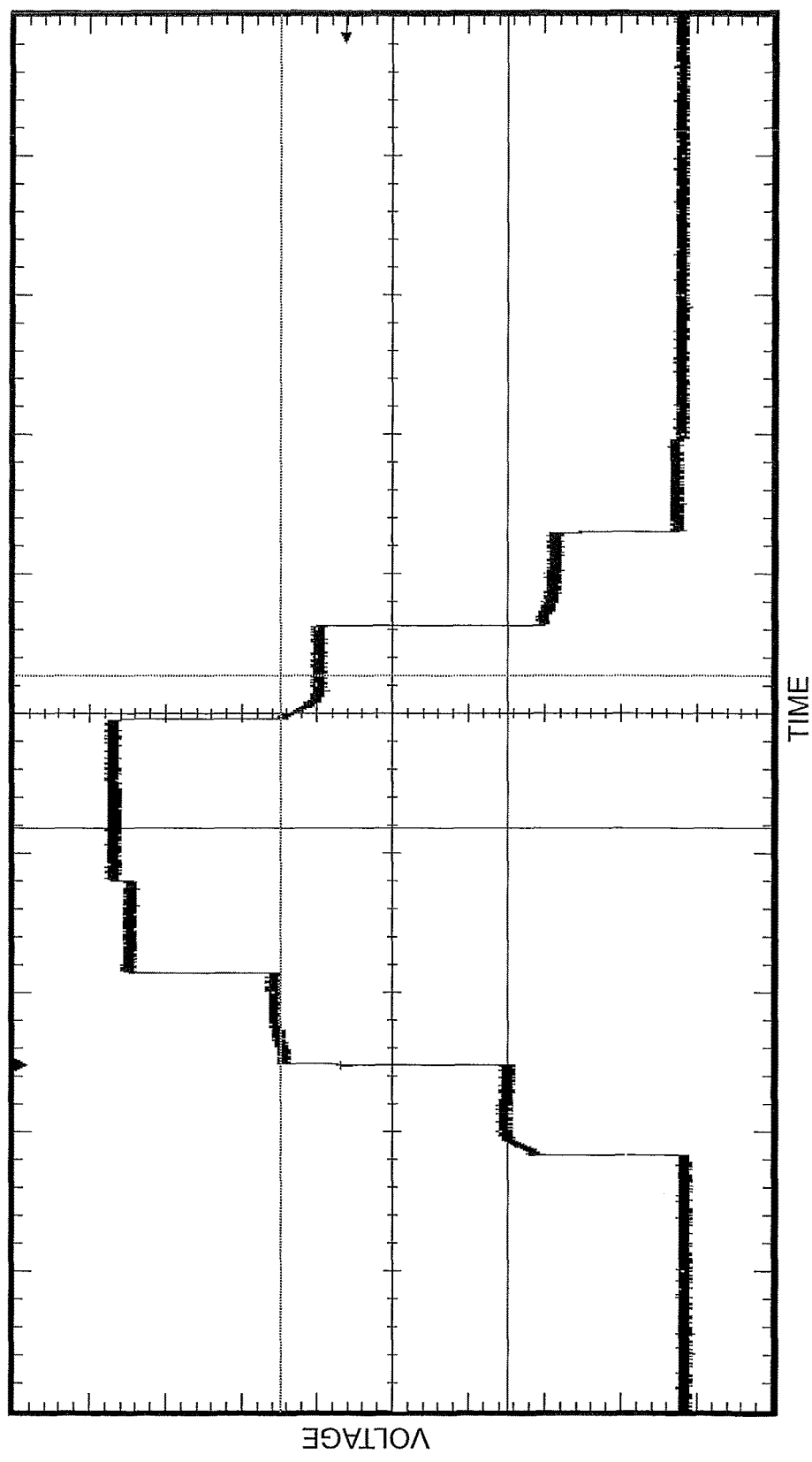
FIG. 20 is a graph showing a measured waveform of a staircase wave pulse output under the input condition (3) shown in FIG. 17.
Figure 21:
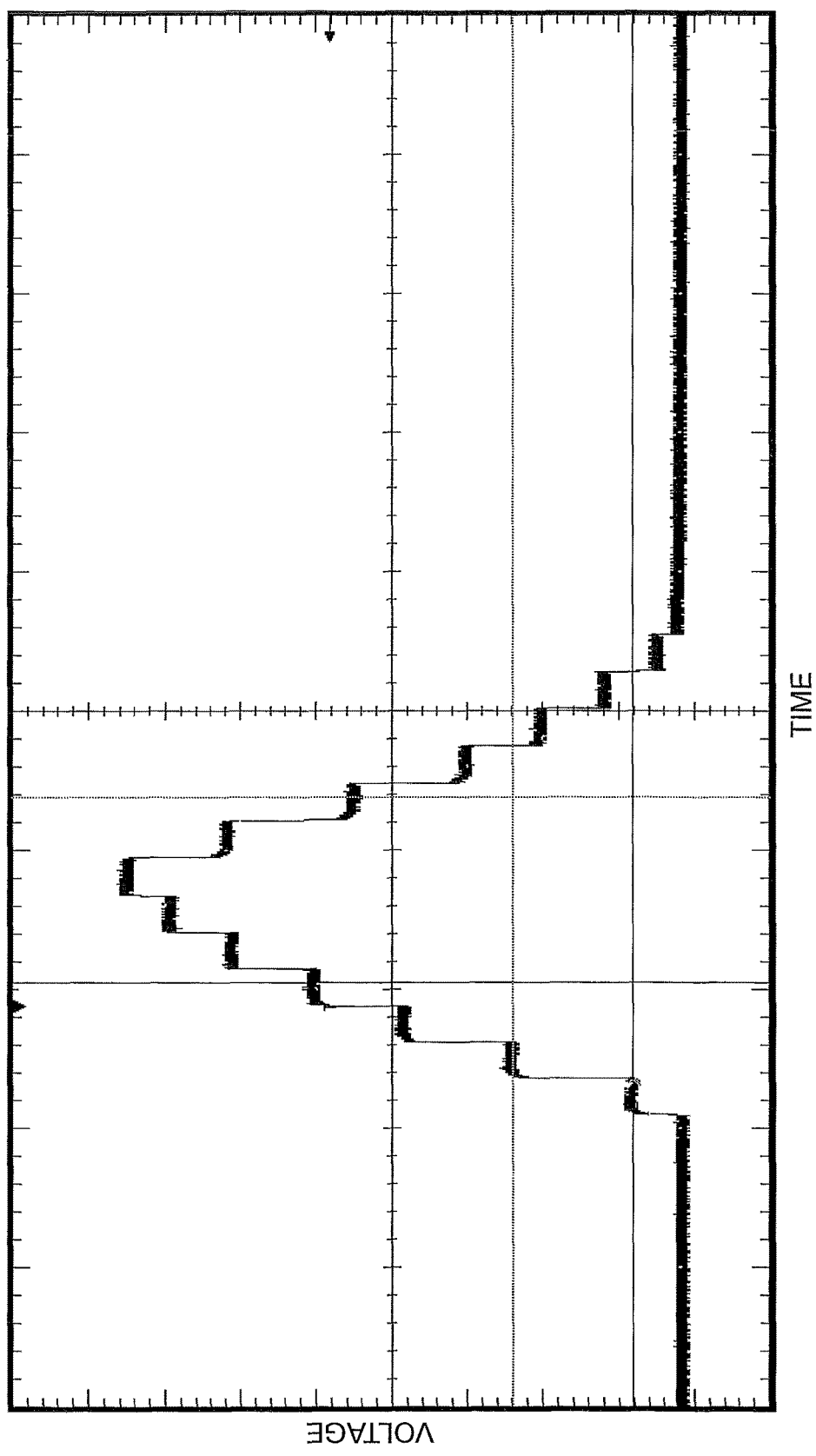
FIG. 21 is a graph showing a measured waveform of a staircase wave pulse output under the input condition (4) shown in FIG. 17.
Figure 22:
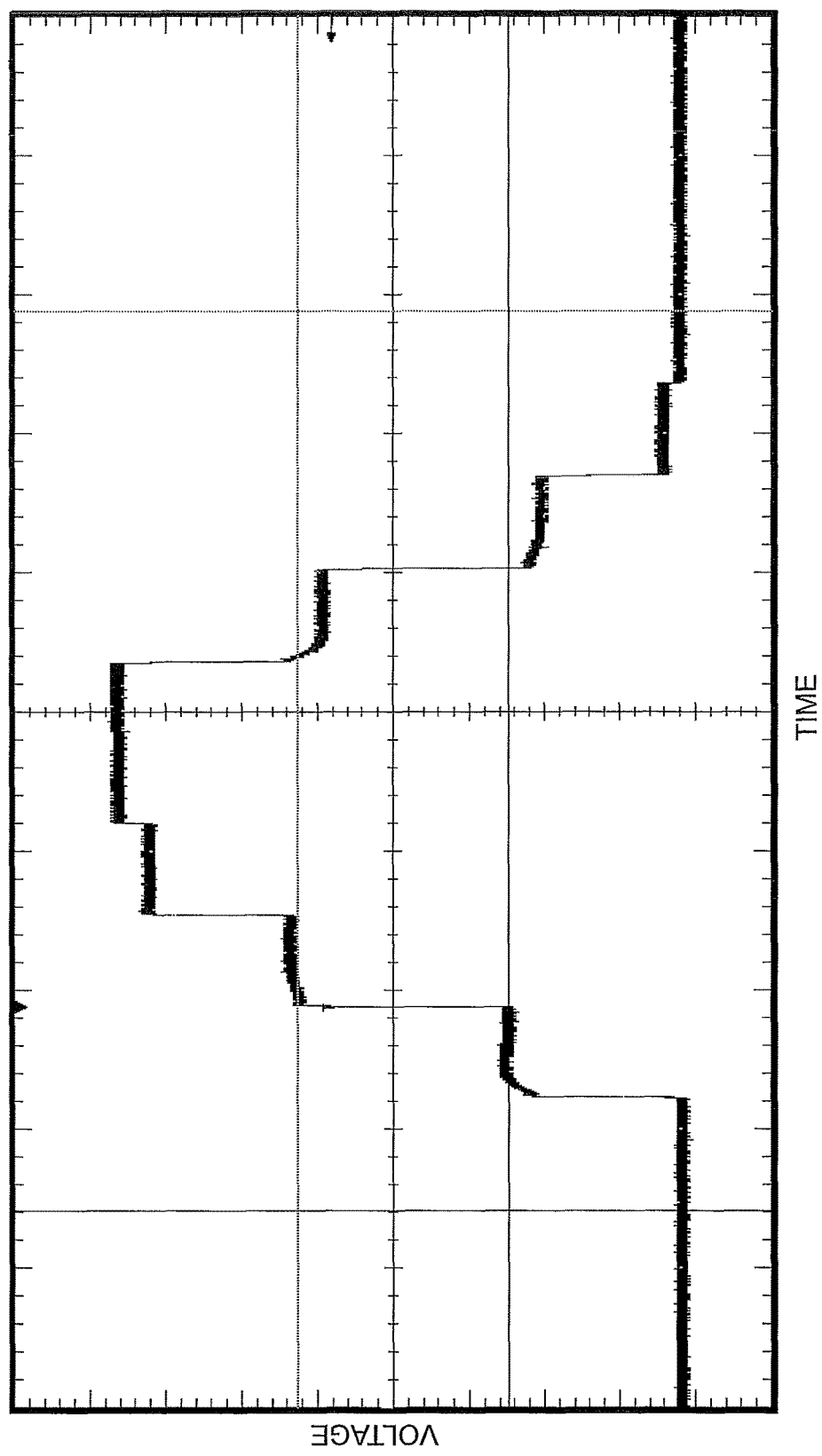
FIG. 22 is a graph showing a measured waveform of a staircase wave pulse output under the input condition (5) shown in FIG. 17.
Figure 23:
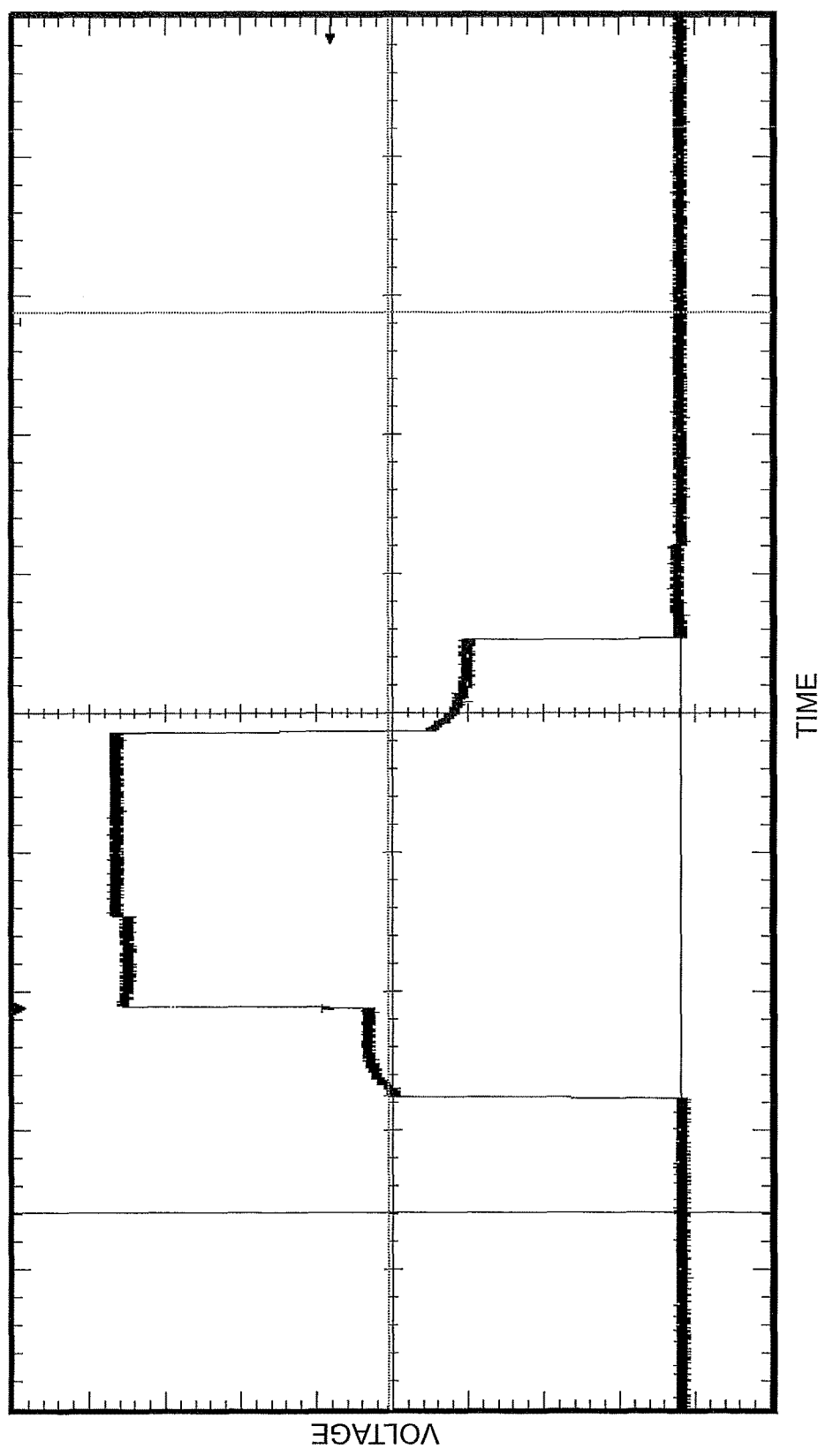
FIG. 23 is a graph showing a measured waveform of a staircase wave pulse output under the input condition (6) shown in FIG. 17.

Further, in the optical amplification device 100, by allowing pulsed seed light to be incident into the optical resonator, a regenerative amplification operation is caused inside the optical resonator along the waveform of the seed light, and it is possible to output pulsed light amplified on the basis of the seed light, as a pulse train with a time interval determined by the optical resonator. Then, it is possible to control the envelope curve of this pulse train to be formed into an arbitrary shape by the capacitive load driving circuit 1A. FIG. 16 is a graph showing an example of such a pulse train. In FIG. 16, the horizontal axis shows the time (40 ns/div), and the vertical axis shows the signal voltage output from the photodetector. As shown in the drawing, in accordance with the optical amplification device 100 of the present embodiment, it is also possible to continuously output a plurality of pulsed light beams with time widths of several picoseconds in the form of a burst for a long time such as several hundreds of nanoseconds.

In addition, by operating the capacitive load driving circuit 1A in the square wave generating mode, it is also possible to perform high-speed switching by a square wave pulse. In that case, it is possible to easily realize the operation of a normal optical amplification device and the cavity dumping oscillation.

As described above, in accordance with the optical amplification device 100 of the present embodiment, it is possible to change an output pulse waveform into an arbitrary shape, and therefore, it is possible to select a suitable output pulse waveform according to a type of an object material to be processed in high-power laser processing for example. In particular, at the time of processing a composite material formed of a plurality of materials, by processing each of the respective materials while changing an output pulse waveform into a suitable waveform, it is possible to process the composite material with extremely high precision.

First Example

Next, an example of a staircase wave pulse when the numbers of inputs, the peak voltage values, and the time widths of the pulsed voltages VP1 and VP2 are variously changed in the capacitive load driving circuit 1A according to the first embodiment will be described. FIG. 17 is a table showing six input conditions (1) to (6) for generating a staircase wave pulse which rises from −1.5 kV to +1.5 kV in a staircase manner, and again falls to −1.5 kV in a staircase manner. In FIG. 17, the peak voltage values and the time widths of the pulsed voltages VP1 and VP2, and the maximum differences in potential in rising and the maximum differences in potential in falling, and the number of steps of the staircase wave pulse outputs output according to the pulsed voltages VP1 and VP2 under the six respective input conditions (1) to (6) are shown.

In addition, in FIG. 17, V_ON indicates a peak voltage value of the pulsed voltage VP1, and V_OFF indicates a peak voltage value of the pulsed voltage VP2. Further, W_ON indicates a time width of the pulsed voltage VP1, and W_OFF indicates a time width of the pulsed voltage VP2. Further, a step voltage (+) indicates the maximum difference in potential among the respective steps during a rising time of a staircase wave pulse output, and a step voltage (−) indicates the maximum difference in potential among the respective steps during a falling time of a staircase wave pulse output, respectively, and the number of steps (+) and the number of steps (−) respectively indicate the number of steps during the rising time and the number of steps during the falling time of the staircase wave pulse output. In addition, the input intervals of the pulsed voltages VP1 and VP2 are set to 1.35 is under any of the conditions.

FIG. 18 to FIG. 23 are graphs showing measured waveforms of a staircase wave pulse output under the six input conditions (1) to (6) shown in FIG. 17. In FIG. 18 to FIG. 23, the horizontal axis shows the time (5 μs/div in FIG. 18 and FIG. 21, and 2 μs/div in the other figures), and the vertical axis shows the voltage. As is clear from these graphs, in accordance with the capacitive load driving circuit 1A according to the first embodiment, it is possible to freely set a waveform (the number of steps and the differences in potential at the respective steps) of a staircase wave pulse output.

Second Example

Figure 24:
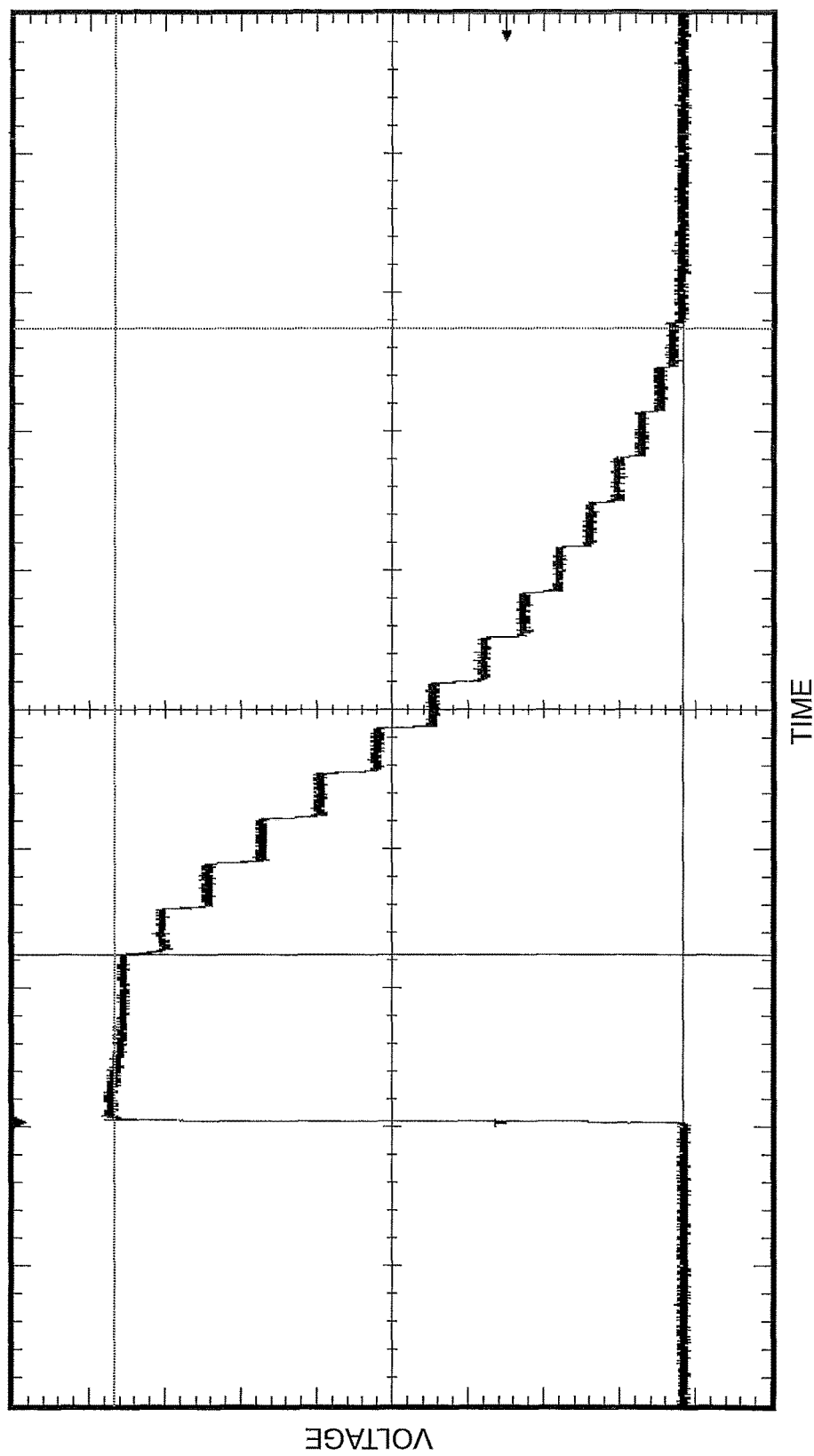
FIG. 24 is a graph showing a waveform of a staircase wave pulse output serving as an object of evaluation of power consumption in a second example.

Next, an example of evaluation of power consumption of the capacitive load driving circuit 1A according to the first embodiment will be described. FIG. 24 is a graph showing a waveform of a staircase wave pulse output serving as an object of evaluation of power consumption in the present example. In the present example, a difference in potential between a peak of a staircase wave pulse output and a reference potential is set to 3 kV, and the staircase wave pulse output is caused to rise at a time within a time of 7 ns or less during voltage rising, and is caused to vary in a staircase manner in 15 steps with a step voltage of 200 V during voltage lowering. In addition, a peak time of the staircase wave pulse output was approximately 100 ns. For example, for the case where pulsed light with a time width of sub-microseconds is output in the optical amplification device according to the fourth embodiment, as shown in FIG. 24, a waveform which is at high speed in rising (<10 ns), and gradually varies in a staircase manner in falling is suitable.

Then, in the case where the staircase wave pulse shown in FIG. 24 is generated at a repetition frequency of 10 kHz (10000 times per second), the power consumption of the entire capacitive load driving circuit was approximately 2 W. It is understood that such a power consumption value is equivalent to that in the case where a square wave pulse is generated at 10 kHz by use of a conventional circuit, and the capacitive load driving circuit 1A is capable of generating a staircase wave pulse without increasing the power consumption. It can be said that such a power consumption value is extremely low even when compared with, for example, the aforementioned staircase wave generating circuit described in Patent Document 2.

That is, in the staircase wave generating circuit in Patent Document 2 that generates a staircase wave pulse by utilizing an output of the amplifier, because it is necessary to continuously flow a current always during generation of a high-voltage, high power consumption is considered to be required. The staircase wave generating circuit in Patent Document 2 is originally not used for the purpose required to perform such a high-speed and high-repetition operation, however, even if it is possible to generate a high-voltage pulse with a peak voltage of 3 kV, a response speed of 10 ns, and a duration time of 1 μs at a repetition frequency of 10 kHz, its power consumption is estimated to be approximately 90 W. This is a value corresponding to 45 times the power consumption of the capacitive load driving circuit 1A.

The capacitive load driving circuit according to the present invention is not limited to the above-described embodiments, and other various modifications are possible. For example, in the capacitive load driving circuit according to the present invention, all additional connections for realizing an effective operation of the entire circuit may be carried out.

Further, in the above-described respective embodiments, the field-effect transistors (FETs) are exemplified as the first and second transistors, however, the first and second transistors may be, for example, insulated gate bipolar transistors (IGBTs). This is because, in an IGBT, an amount of current increases according to a gate input voltage in the case where a collector-emitter voltage is high in the same manner as an FET. In that case, in the above-described respective embodiments, the drains are replaced with the collectors, and the sources are replaced with the emitters.

The first capacitive load driving circuit according to the above-described embodiment which has an output terminal connected to a capacitive load, and selectively outputs one of a staircase wave and a square wave from the output terminal, to drive the capacitive load, the capacitive load driving circuit includes (1) a first constant potential line for supplying a first constant voltage, (2) a first transistor whose one current terminal is connected to the output terminal, and whose other current terminal is connected to the first constant potential line, (3) a first transformer which has an input side coil and an output side coil, and the output side coil is connected to a control terminal of the first transistor, (4) a first input terminal which is connected to one end of the input side coil of the first transformer via a capacitive element, and to which a first pulsed voltage is input, (5) a second constant potential line for supplying a second constant voltage lower than the first constant voltage, (6) a second transistor whose one current terminal is connected to the output terminal, and whose other current terminal is connected to the second constant potential line, (7) a second transformer which has an input side coil and an output side coil, and the output side coil is connected to a control terminal of the second transistor, and (8) a second input terminal which is connected to one end of the input side coil of the second transformer via a capacitive element, and to which a second pulsed voltage is input. Then, levels of pulsed voltages to be input to the control terminals of the first and second transistors by the first and second pulsed voltages are higher than or equal to respective threshold voltages of the first and second transistors.

Further, a second capacitive load driving circuit according to the above-described embodiment which has an output terminal connected to a capacitive load, and selectively outputs one of a staircase wave and a square wave from the output terminal, to drive the capacitive load, the capacitive load driving circuit includes (1) a first constant potential line for supplying a first constant voltage, (2) M (where M is an integer of 2 or more) first transistors which are connected in series between the output terminal and the first constant potential line, (3) M first transformers which respectively have input side coils and output side coils, and the output side coils are connected to respective control terminals of the M first transistors, (4) a first input terminal which is connected to one ends of the respective input side coils of the M first transformers via capacitive elements, and to which a first pulsed voltage is input, (5) a second constant potential line for supplying a second constant voltage lower than the first constant voltage, (6) N (where N is an integer of 2 or more) second transistors which are connected in series between the output terminal and the second constant potential line, (7) N second transformers which respectively have input side coils and output side coils, and the output side coils are connected to respective control terminals of the N second transistors, and (8) a second input terminal which is connected to one ends of the respective input side coils of the N second transformers via capacitive elements, and to which a second pulsed voltage is input. Then, levels of pulsed voltages to be input to the control terminals of the first and second transistors by the first and second pulsed voltages are higher than or equal to respective threshold voltages of the first and second transistors.

Further, in the second capacitive load driving circuit, the other ends of the input side coils of the M first transformers and the N second transformers may be connected to a third constant potential line in common with each other.

Further, the third capacitive load driving circuit according to the above-described embodiment adopts a configuration which includes first and second driving circuits which respectively have the configuration of any one of the capacitive load driving circuits described above, and in which an output terminal of the first driving circuit is connected to one electrode of the capacitive load, and an output terminal of the second driving circuit is connected to the other electrode of the capacitive load. In this way, staircase wave-shaped (or square wave-shaped) voltages are individually provided to both the pair of electrodes of the capacitive load, thereby it is possible to increase (for example, double) an amount of changes in voltage between the both ends of the capacitive load.

Further, in the third capacitive load driving circuit, the first and second driving circuits may have the first constant potential line in common with each other and the second constant potential line in common with each other. Thereby, it is possible to downsize the capacitive load driving circuit.

Further, in the first to third capacitive load driving circuits, the capacitive load may be a modulation element utilizing an electro-optic effect. In addition, the respective capacitive load driving circuits according to the present invention may be applied, not only to an electro-optic modulation element such as a Pockels cell, but also for driving of various loads with a given capacity.

INDUSTRIAL APPLICABILITY

The present invention is applicable as a capacitive load driving circuit which is capable of providing a stair-shaped high-voltage pulse to a capacitive load such as an electro-optic modulation element, and is capable of variously changing the number of steps, the amounts of changes in voltage at the respective steps, and further the time widths of the respective steps.

REFERENCE SIGNS LIST 1A, 1C, 1D—capacitive load driving circuit, 10A, 10C—first driving circuit, 10B, 10D—second driving circuit, 11—output terminal, 12a—first input terminal, 12b—second input terminal, 20—first switching circuit, 21—first FET, 22—first transformer, 23—first capacitive element, 30—second switching circuit, 31—second FET, 32—second transformer, 33—second capacitive element, 40—reference potential line, 41—first high-voltage power source, 42—second high-voltage power source, 52—capacitive load, 54—pulsed voltage generating circuit, 100—optical amplification device, 110—optical amplification unit, 111—optical amplifying medium, 112—transparent medium, 117—mirror, 130—energy supply unit, 141, 143—wave plate, 151—light modulation element, 161, 163—polarizing beam splitter, 170—Faraday rotator, VP1, VP11, VP12—first pulsed voltage, VP2, VP21, VP22—second pulsed voltage.

The invention claimed is:
1. A capacitive load driving circuit comprising:
an output terminal:
a first constant potential line supplying a first constant voltage;
a first transistor whose one current terminal is directly connected to the output terminal, and whose other current terminal is directly connected to the first constant potential line;
a first transformer which has an input side coil and an output side coil, and the output side coil is connected to a control terminal of the first transistor;
a first input terminal which is connected to one end of the input side coil of the first transformer via a capacitive element, and to which a first pulsed voltage is input;
a second constant potential line supplying a second constant voltage lower than the first constant voltage;
a second transistor whose one current terminal is connected to the output terminal, and whose other current terminal is connected to the second constant potential line;
a second transformer provided separately from the first transformer and which has an input side coil and an output side coil, and the output side coil is connected to a control terminal of the second transistor;
a second input terminal which is connected to one end of the input side coil of the second transformer via a capacitive element, and to which a second pulsed voltage is input; and
a resistor which is connected between the second constant potential line and the output terminal, the circuit wherein
the capacitive load driving circuit is configured to selectively output one of a staircase wave and a square wave from the output terminal, to drive a capacitive load connected to the output terminal,
levels of pulsed voltages to be input to the control terminals of the first and second transistors by the first and second pulsed voltages are higher than or equal to respective threshold voltages of the first and second transistors, and wherein
the first constant voltage is a constant voltage of 1000 volts or higher.
2. A capacitive load driving circuit comprising:
an output terminal;
a first constant potential line supplying a first constant voltage;
M (where M is an integer of 2 or more) first transistors which are connected in series between the output terminal and the first constant potential line;
M first transformers which respectively have input side coils and output side coils, and the output side coils are connected to respective control terminals of the M first transistors;

a first input terminal which is connected to one ends of the respective input side coils of the M first transformers via capacitive elements, and to which a first pulsed voltage is input;

a second constant potential line supplying a second constant voltage lower than the first constant voltage;

N (where N is an integer of 2 or more) second transistors which are connected in series between the output terminal and the second constant potential line;

N second transformers provided separately from the M first transformers and which respectively have input side coils and output side coils, and the output side coils are connected to respective control terminals of the N second transistors;

a second input terminal which is connected to one ends of the respective input side coils of the N second transformers via capacitive elements, and to which a second pulsed voltage is input; and a resistor which is connected between the second constant potential line and the output terminal, the circuit wherein the capacitive load driving circuit is configured to selectively output one of a staircase wave and a square wave from the output terminal, to drive a capacitive load connected to the output terminal, levels of pulsed voltages to be input to the control terminals of the first and second transistors by the first and second pulsed voltages are higher than or equal to respective threshold voltages of the first and second transistors, and wherein the first constant voltage is a constant voltage of 1000 volts or higher.

3. The capacitive load driving circuit according to claim 2, wherein the other ends of the input side coils of the M first transformers and the N second transformers are connected to a third constant potential line in common with each other.

4. A capacitive load driving circuit comprising first and second driving circuits which respectively have the configuration of the capacitive load driving circuit according to claim 1, the circuit wherein the output terminal of the first driving circuit is connected to one electrode of the capacitive load, and an output terminal of the second driving circuit is connected to an other electrode of the capacitive load.

5. The capacitive load driving circuit according to claim 4, wherein the first and second driving circuits have the first constant potential line in common with each other and the second constant potential line in common with each other.

6. The capacitive load driving circuit according to claim 1, wherein the capacitive load is a modulation element utilizing an electro-optic effect.

7. The capacitive load driving circuit according to claim 2, wherein the capacitive load is a modulation element utilizing an electro-optic effect.

8. A capacitive load driving circuit comprising first and second driving circuits which respectively have the configuration of the capacitive load driving circuit according to claim 2, the circuit wherein the output terminal of the first driving circuit is connected to one electrode of the capacitive load, and an output terminal of the second driving circuit is connected to an other electrode of the capacitive load.

9. The capacitive load driving circuit according to claim 8, wherein the first and second driving circuits have the first constant potential line in common with each other and the second constant potential line in common with each other.

10. A capacitive load driving circuit comprising a first driving circuit which has the configuration of the capacitive load driving circuit according to claim 1, and a second driving circuit which has an output terminal connected to a capacitive load, the circuit wherein the output terminal of the first driving circuit is connected to one electrode of the capacitive load, and the output terminal of the second driving circuit is connected to an other electrode of the capacitive load, and wherein the second driving circuit has the configuration of a capacitive load driving circuit which selectively outputs one of a staircase wave and a square wave from the output terminal, to drive the capacitive load, and the second driving circuit comprises:

a first constant potential line supplying a first constant voltage;

M (where M is an integer of 2 or more) first transistors which are connected in series between the output terminal and the first constant potential line;

M first transformers which respectively have input side coils and output side coils, and the output side coils are connected to respective control terminals of the M first transistors;

a first input terminal which is connected to one ends of the respective input side coils of the M first transformers via capacitive elements, and to which a first pulsed voltage is input;

a second constant potential line supplying a second constant voltage lower than the first constant voltage;

N (where N is an integer of 2 or more) second transistors which are connected in series between the output terminal and the second constant potential line;

N second transformers which respectively have input side coils and output side coils, and the output side coils are connected to respective control terminals of the N second transistors; and a second input terminal which is connected to one ends of the respective input side coils of the N second transformers via capacitive elements, and to which a second pulsed voltage is input, the circuit wherein levels of pulsed voltages to be input to the control terminals of the first and second transistors by the first and second pulsed voltages are higher than or equal to respective threshold voltages of the first and second transistors.

11. The capacitive load driving circuit according to claim 10, wherein the first and second driving circuits have the first constant potential line in common with each other and the second constant potential line in common with each other.

12. The capacitive load driving circuit according to claim 1, wherein at the time of outputting the staircase wave, at least one of the first transistor and the second transistor is brought into an on-state plural times, and at the time of outputting the square wave, each of the first transistor and the second transistor is brought into an on-state only once.

13. The capacitive load driving circuit according to claim 2, wherein at the time of outputting the staircase wave, at least one of the first transistor and the second transistor is brought into an on-state plural times, and at the time of outputting the square wave, each of the first transistor and the second transistor is brought into an on-state only once.

14. A capacitive load driving circuit for driving a capacitive load comprising:
- a first driving circuit having a first output terminal which is connected to a first electrode of the capacitive load; and
- a second driving circuit having a second output terminal which is connected to a second electrode of the capacitive load, wherein
- the first driving circuit is a driving circuit for selectively outputting one of a staircase wave and a square wave from the first output terminal, to drive the capacitive load, and including:
- a first constant potential line supplying a first constant voltage;
- a first transistor whose one current terminal is connected to the first output terminal, and whose other current terminal is connected to the first constant potential line;
- a first transformer which has an input side coil and an output side coil, and the output side coil is connected to a control terminal of the first transistor;
- a first input terminal which is connected to one end of the input side coil of the first transformer via a capacitive element, and to which a first pulsed voltage is input;
- a second constant potential line supplying a second constant voltage lower than the first constant voltage;
- a second transistor whose one current terminal is connected to the first output terminal, and whose other current terminal is connected to the second constant potential line;
- a second transformer which has an input side coil and an output side coil, and the output side coil is connected to a control terminal of the second transistor; and
- a second input terminal which is connected to one end of the input side coil of the second transformer via a capacitive element, and to which a second pulsed voltage is input, wherein
- levels of pulsed voltages to be input to the control terminals of the first and second transistors by the first and second pulsed voltages are higher than or equal to respective threshold voltages of the first and second transistors, and wherein
- the second driving circuit is a driving circuit for selectively outputting one of a staircase wave and a square wave from the second output terminal, to drive the capacitive load, and including:
- a third constant potential line supplying a third constant voltage;
- a third transistor whose one current terminal is connected to the second output terminal, and whose other current terminal is connected to the third constant potential line;
- a third transformer which has an input side coil and an output side coil, and the output side coil is connected to a control terminal of the third transistor;
- a third input terminal which is connected to one end of the input side coil of the third transformer via a capacitive element, and to which a third pulsed voltage is input;
- a fourth constant potential line supplying a fourth constant voltage lower than the third constant voltage;
- a fourth transistor whose one current terminal is connected to the second output terminal, and whose other current terminal is connected to the fourth constant potential line;
- a fourth transformer which has an input side coil and an output side coil, and the output side coil is connected to a control terminal of the fourth transistor; and
- a fourth input terminal which is connected to one end of the input side coil of the fourth transformer via a capacitive element, and to which a fourth pulsed voltage is input, wherein
- levels of pulsed voltages to be input to the control terminals of the third and fourth transistors by the third and fourth pulsed voltages are higher than or equal to respective threshold voltages of the third and fourth transistors.

15. A capacitive load driving circuit for driving a capacitive load comprising:
- a first driving circuit having a first output terminal which is connected to a first electrode of the capacitive load; and
- a second driving circuit having a second output terminal which is connected to a second electrode of the capacitive load, wherein
- the first driving circuit is a driving circuit for selectively outputting one of a staircase wave and a square wave from the first output terminal, to drive the capacitive load, and including:
- a first constant potential line supplying a first constant voltage;
- M (where M is an integer of 2 or more) first transistors which are connected in series between the first output terminal and the first constant potential line;
- M first transformers which respectively have input side coils and output side coils, and the output side coils are connected to respective control terminals of the M first transistors;
- a first input terminal which is connected to one ends of the respective input side coils of the M first transformers via capacitive elements, and to which a first pulsed voltage is input;
- a second constant potential line supplying a second constant voltage lower than the first constant voltage;
- N (where N is an integer of 2 or more) second transistors which are connected in series between the first output terminal and the second constant potential line;
- N second transformers which respectively have input side coils and output side coils, and the output side coils are connected to respective control terminals of the N second transistors; and
- a second input terminal which is connected to one ends of the respective input side coils of the N second transformers via capacitive elements, and to which a second pulsed voltage is input, wherein
- levels of pulsed voltages to be input to the control terminals of the first and second transistors by the first and second pulsed voltages are higher than or equal to respective threshold voltages of the first and second transistors, and wherein
- the second driving circuit is a driving circuit for selectively outputting one of a staircase wave and a square wave from the second output terminal, to drive the capacitive load, and including:
- a third constant potential line supplying a third constant voltage;
- M (where M is an integer of 2 or more) third transistors which are connected in series between the second output terminal and the third constant potential line;
- M third transformers which respectively have input side coils and output side coils, and the output side coils are connected to respective control terminals of the M third transistors;

a third input terminal which is connected to one ends of the respective input side coils of the M third transformers via capacitive elements, and to which a third pulsed voltage is input;

a fourth constant potential line supplying a fourth constant voltage lower than the third constant voltage;

N (where N is an integer of 2 or more) fourth transistors which are connected in series between the second output terminal and the fourth constant potential line;

N fourth transformers which respectively have input side coils and output side coils, and the output side coils are connected to respective control terminals of the N fourth transistors; and a fourth input terminal which is connected to one ends of the respective input side coils of the N fourth transformers via capacitive elements, and to which a fourth pulsed voltage is input, wherein levels of pulsed voltages to be input to the control terminals of the third and fourth transistors by the third and fourth pulsed voltages are higher than or equal to respective threshold voltages of the third and fourth transistors.

16. A capacitive load driving circuit for driving a capacitive load comprising:

a first driving circuit having a first output terminal which is connected to a first electrode of the capacitive load; and a second driving circuit having a second output terminal which is connected to a second electrode of the capacitive load, wherein the first driving circuit is a driving circuit for selectively outputting one of a staircase wave and a square wave from the first output terminal, to drive the capacitive load, and including:

a first constant potential line supplying a first constant voltage;

a first transistor whose one current terminal is connected to the first output terminal, and whose other current terminal is connected to the first constant potential line;

a first transformer which has an input side coil and an output side coil, and the output side coil is connected to a control terminal of the first transistor;

a first input terminal which is connected to one end of the input side coil of the first transformer via a capacitive element, and to which a first pulsed voltage is input;

a second constant potential line supplying a second constant voltage lower than the first constant voltage;

a second transistor whose one current terminal is connected to the first output terminal, and whose other current terminal is connected to the second constant potential line;

a second transformer which has an input side coil and an output side coil, and the output side coil is connected to a control terminal of the second transistor; and a second input terminal which is connected to one end of the input side coil of the second transformer via a capacitive element, and to which a second pulsed voltage is input, wherein levels of pulsed voltages to be input to the control terminals of the first and second transistors by the first and second pulsed voltages are higher than or equal to respective threshold voltages of the first and second transistors, and wherein the second driving circuit is a driving circuit for selectively outputting one of a staircase wave and a square wave from the second output terminal, to drive the capacitive load, and including:

a third constant potential line supplying a third constant voltage;

M (where M is an integer of 2 or more) third transistors which are connected in series between the second output terminal and the third constant potential line;

M third transformers which respectively have input side coils and output side coils, and the output side coils are connected to respective control terminals of the M third transistors;

a third input terminal which is connected to one ends of the respective input side coils of the M third transformers via capacitive elements, and to which a third pulsed voltage is input;

a fourth constant potential line supplying a fourth constant voltage lower than the third constant voltage;

N (where N is an integer of 2 or more) fourth transistors which are connected in series between the second output terminal and the fourth constant potential line;

N fourth transformers which respectively have input side coils and output side coils, and the output side coils are connected to respective control terminals of the N fourth transistors; and a fourth input terminal which is connected to one ends of the respective input side coils of the N fourth transformers via capacitive elements, and to which a fourth pulsed voltage is input, wherein levels of pulsed voltages to be input to the control terminals of the third and fourth transistors by the third and fourth pulsed voltages are higher than or equal to respective threshold voltages of the third and fourth transistors.

* * * * *